United States Patent
Kang et al.

(10) Patent No.: US 12,464,942 B2
(45) Date of Patent: Nov. 4, 2025

(54) PREPARATION OF N∧N∧C∧O TETRADENTATE PLATINUM (II) COMPLEX AND USES THEREOF

(71) Applicant: GUANGDONG AGLAIA OPTOELECTRONIC MATERIALS CO., LTD, Guangdong (CN)

(72) Inventors: Jian Kang, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 1115 days.

(21) Appl. No.: 17/298,002

(22) PCT Filed: Nov. 2, 2019

(86) PCT No.: PCT/CN2019/115181
§ 371 (c)(1),
(2) Date: Mar. 10, 2022

(87) PCT Pub. No.: WO2020/134569
PCT Pub. Date: Jul. 2, 2020

(65) Prior Publication Data
US 2022/0115605 A1    Apr. 14, 2022

(30) Foreign Application Priority Data
Dec. 28, 2018  (CN) .......................... 201811628779.6

(51) Int. Cl.
| | | |
|---|---|---|
| C07D 213/74 | (2006.01) | |
| C07F 15/00 | (2006.01) | |
| C09K 11/06 | (2006.01) | |
| H10K 85/30 | (2023.01) | |
| H10K 50/11 | (2023.01) | |
| H10K 101/10 | (2023.01) | |

(52) U.S. Cl.
CPC ......... *H10K 85/346* (2023.02); *C07D 213/74* (2013.01); *C07F 15/0086* (2013.01); *C09K 11/06* (2013.01); *C09K 2211/1044* (2013.01); *C09K 2211/185* (2013.01); *H10K 50/11* (2023.02); *H10K 2101/10* (2023.02)

(58) Field of Classification Search
CPC .................................................... H10K 85/346
See application file for complete search history.

(56) References Cited

U.S. PATENT DOCUMENTS

| | | | |
|---|---|---|---|
| 2007/0103060 A1 | 5/2007 | Itoh et al. | |
| 2015/0194615 A1 | 7/2015 | Lin et al. | |
| 2017/0237023 A1 | 8/2017 | Kim et al. | |
| 2019/0019964 A1 | 1/2019 | Jeon et al. | |
| 2019/0100546 A1 | 4/2019 | Baik et al. | |

FOREIGN PATENT DOCUMENTS

| | | | | |
|---|---|---|---|---|
| CN | 1875026 A | 12/2006 | | |
| CN | 107056844 A | 8/2017 | | |
| CN | 109251223 A | 1/2019 | | |
| EP | 3205659 A1 | * 8/2017 | ......... | A61K 49/0015 |

OTHER PUBLICATIONS

Dorwald F. A. Side Reactions in Organic Synthesis, 2005, Wiley: VCH, Weinheim p. IX of Preface p. 1-15.*
Heravi, Buchwald-Hartwig reaction: An overview. Journal of Organometallic Chemistry 861 (2018) 17e104.*
Ogata, Palladium-Catalyzed Amination of Aryl and Heteroaryl Tosylates at Room Temperature, J Am Chem Soc. Oct. 22, 2008; 130(42): 13848-13849.*
Farhang, A retrospective-prospective review of Suzuki-Miyaura reaction. From cross-coupling reaction to pharmaceutical industry applications, Polyhedron vol. 227, Nov. 15, 2022, 116124.*

* cited by examiner

*Primary Examiner* — Nizal S Chandrakumar
(74) *Attorney, Agent, or Firm* — Maschoff Brennan

(57) ABSTRACT

The present invention relates to preparation and application of a N^N^C^O tetradentate platinum (II) complex, and belongs to the field of an OLED organic electroluminescence material. The complex of the present invention has the following structural formula, is used for a phosphorescent doped material achieving a photon emission effect in a light-emitting layer of an OLED luminescent device. The complex of the present invention has the advantages of high fluorescence quantum efficiency, high thermal stability and low quenching constant, and can be used for manufacturing an orange red light OLED device with a high luminous efficiency and a low roll-off factor.

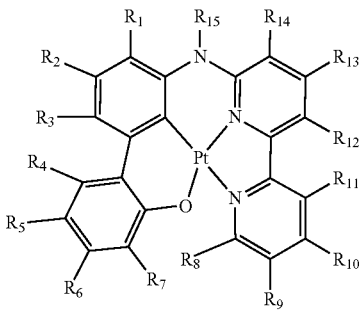

18 Claims, 1 Drawing Sheet

| |
|---|
| 70 |
| 60 |
| 50 |
| 40 |
| 30 |
| 20 |
| 10 |

PREPARATION OF N∧N∧C∧O TETRADENTATE PLATINUM (II) COMPLEX AND USES THEREOF

TECHNICAL FIELD

The present invention relates to a novel N^N^C^O tetradentate platinum (II) complex metal organic material, and more particularly relates to a phosphorescent doped material achieving a photon emission effect in a light-emitting layer of an OLED light-emitting device.

BACKGROUND

Organic Light-Emitting Diodes (OLEDs) have been widely concerned and studied all the time because of their advantages of self-luminescence, wide viewing angle, almost infinite contrast, lower power consumption, extremely high reaction speed, potential flexible foldability, etc.

In the field of an OLED material, the development of a phosphorescent OLED light-emitting layer doped material is fast and mature. It is mainly based on some heavy metal organic complexes, such as iridium, platinum, europium and osmium. The phosphorescent material can sufficiently utilize singlet and triplet exciton energy in the light-emitting process, so that its quantum efficiency can theoretically reach 100%. Therefore, the phosphorescent material is a light-emitting material with wider application in the industry at present.

Phosphorescent OLED materials based on platinum (II) have shown better display performance in recent years. Platinum (II) generally has four-coordinated sites, and a metal organic platinum (II) complex with a unique configuration can be formed by designing a tetradentate ligand. However, compared with application of mature iridium (III) complex light-emitting materials, the development and application of the platinum (II) complex are relatively slow. Especially for the development of novel platinum (II) complex phosphorescent light-emitting materials, the promotion of the commercial application of the platinum (II) complex is particularly important.

SUMMARY

A novel N^N^C^O tetradentate platinum (II) complex metal organic material of the present invention has a structure as shown in the following FIGURE:

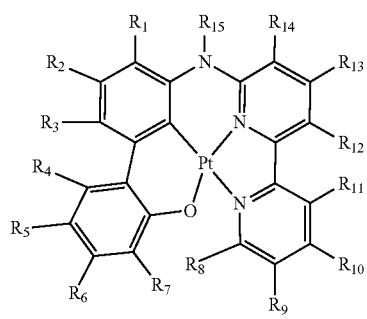

wherein $R_1$ to $R_{15}$ are independently selected from hydrogen, deuterium, sulfur, halogen, a hydroxyl group, an acyl group, an alkoxy group, an acyloxy group, an amino group, a nitryl group, an acylamino group, a cyano group, a carboxyl group, a styryl group, an aminocarbonyl group, a carbamoyl group, a benzylcarbonyl group, an aryloxy group, a diarylamine group, a saturated alkyl group containing 1 to 30 carbon atoms, an unsaturated alkyl group containing 1 to 20 carbon atoms, a substituted or unsubstituted aryl group containing 5 to 30 carbon atoms, or a substituted or unsubstituted heteroaryl group containing 5 to 30 carbon atoms, or adjacent $R_1$ to $R_{15}$ are connected to each other by a covalent bond to form a ring.

Preferably, $R_1$ to $R_{15}$ are independently selected from hydrogen, halogen, an amino group, a nitryl group, a cyano group, a diarylamine group, a saturated alkyl group containing 1 to 10 carbon atoms, an aryl group containing 5 to 20 carbon atoms and unsubstituted or substituted by halogen or one or more C1 to C4 alkyl groups, or a heteroaryl group containing 5 to 20 carbon atoms and unsubstituted or substituted by halogen or one or more C1 to C4 alkyl groups, or adjacent $R_1$ to $R_{15}$ are connected to each other by a covalent bond to form a ring, wherein the halogen is F, Cl or Br.

Preferably, 0 to 3 of the 15 groups of $R_1$ to $R_{15}$ are independently represented as a diarylamine group, an aryl group containing 5 to 10 carbon atoms and unsubstituted or substituted by halogen or 1 to 3 C1 to C4 alkyl groups, a N-containing heteroaryl group containing 5 to 10 carbon atoms or unsubstituted or substituted by halogen or 1 to 3 C1 to C4 alkyl groups; and other groups are independently represented as hydrogen or a saturated alkyl group containing 1 to 8 carbon atoms, and the halogen is F or Cl.

Preferably, 0 to 3 of the 15 groups of $R_1$ to $R_{15}$ are independently represented as a diphenylamine group, a phenyl group, a pyridyl group or a carbazolyl group, and other groups are independently represented as hydrogen, fluorine or a saturated alkyl group containing 1 to 4 carbon atoms.

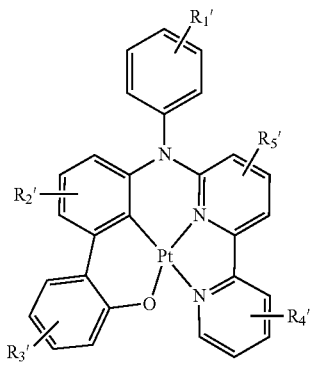

wherein $R_1'$ to $R_5'$ are independently selected from hydrogen, halogen, a diarylamine group, a saturated alkyl group containing 1 to 10 carbon atoms, an aryl group containing 5 to 20 carbon atoms and unsubstituted or substituted by halogen or one or more C1 to C4 alkyl groups, or a heteroaryl group containing 5 to 20 carbon atoms and unsubstituted or substituted by halogen or one or more C1 to C4 alkyl groups, or adjacent $R_1'$ to $R_5'$ are connected to each other by a covalent bond to form a ring, wherein the halogen is F, Cl or Br.

Preferably, 0 to 3 of the 5 groups of $R_1'$ to $R_5'$ are independently represented as a diarylamine group, an aryl group containing 5 to 10 carbon atoms and unsubstituted or substituted by halogen or 1 to 3 C1 to C4 alkyl groups, or a heteroaryl group containing 5 to 10 carbon atoms and unsubstituted or substituted by halogen or 1 to 3 C1 to C4 alkyl groups; and other groups are independently represented as hydrogen, halogen or a saturated alkyl group containing 1 to 8 carbon atoms, wherein the halogen is F or Cl.

Preferably, 0 to 3 of the 5 groups of $R_1'$ to $R_5'$ are independently represented as a diphenylamine group, a phenyl group unsubstituted or substituted by C1 to C4 alkyl groups, a pyridyl group or a carbazolyl group, and other groups are independently represented as hydrogen, fluorine or a saturated alkyl group containing 1 to 4 carbon atoms.

For the purposes of the present application, unless otherwise specified, the terms of halogen, alkyl group, alkenyl group, aryl group, acyl group, alkoxy group and heterocyclic aromatic system or heterocyclic aromatic group may have the following meanings:

The above halogen or halogenation includes fluorine, chlorine, bromine and iodine, preferably F, Cl or Br, more preferably F or Cl, and most preferably F.

The above ring formed by connection by a covalent bond, the aryl group or the heteroaryl group includes an aryl group containing 5 to 30 carbon atoms, preferably 5 to 20 carbon atoms, more preferably 5 to 10 carbon atoms and consisting of one aromatic ring or a plurality of condensed aromatic rings. A suitable aryl group, for example, is a phenyl group, a naphthyl group, an acenaphthenyl group, an acenaphthenyl group, an anthracenyl group, a fluorenyl group, or a phenalenyl group. The aryl group may be unsubstituted (i.e., all carbon atoms capable of being substituted carry hydrogen atoms) or substituted at one, more than one, or all substitutable positions of the aryl group. A suitable substituent group is, for example, halogen, preferably F, Br or Cl; an alkyl group, preferably an alkyl group containing 1 to 20, 1 to 10 or 1 to 8 carbon atoms, and particularly preferably a methyl group, an ethyl group, an isopropyl group or a tert-butyl group; an aryl group, preferably a re-substitutable or unsubstituted $C_5$, $C_6$ aryl group or fluorenyl group; a heteroaryl group, preferably a heteroaryl group containing at least one nitrogen atom, and particularly preferably a pyridyl group; an aryl group, particularly preferably carrying a substituent group selected from F and a tert-butyl group, preferably an aryl group capable of being a given aryl group or a $C_5$, $C_6$ aryl group optionally substituted by at least one of the above substituent group, wherein the $C_5$, $C_6$ aryl group particularly preferably carries 0, 1 or 2 of the above substituents, the $C_5$, $C_6$ aryl group is particularly preferably an unsubstituted phenyl group or a substituted phenyl group, such as a biphenyl group and a phenyl group substituted by two tert-butyl groups preferably in the meta position.

The unsaturated alkyl group containing 1 to 20 carbon atoms is preferably an alkenyl group, more preferably an alkenyl group with a double bond, and particularly preferably an alkenyl group with a double bond and 1 to 8 carbon atoms.

The alkyl group includes an alkyl group containing 1 to 30 carbon atoms, preferably 1 to 10 carbon atoms, and more preferably 1 to 4 carbon atoms. The alkyl group may be branched or linear, or cyclic, and may be interrupted by one or more heteroatoms, preferably by N, O, or S. Furthermore, the alkyl group may be substituted by one or more halogens or the above substituent groups relevant to the aryl group.

Similarly, for the alkyl group, it is possible to carry one or more aryl groups, all of the above aryl groups are suitable for this purpose, and the alkyl group is particularly preferably selected from a methyl group, an ethyl group, an isopropyl group, an n-propyl group, an isobutyl group, a n-butyl group, a tert-butyl group, a sec-butyl group, an isopentyl group, a cyclopropyl group, a cyclopentyl group, and a cyclohexyl group.

The acyl group is connected to a CO group by a single bond, such as the alkyl group used herein.

The alkoxy group is directly connected to oxygen by a single bond, such as the alkyl group used herein.

The heteroaryl group is understood to be related to an aromatic, $C_3$-$C_8$ ring group, and also contains an oxygen or sulfur atom or 1-4 nitrogen atoms or a combination of an oxygen or sulfur atom and at most two nitrogen atoms, and their substituted and benzo and pyrido fused derivatives, for example, through connection by one of ring-forming carbon atoms, the heteroaryl group may be substituted by one or more of the substituent groups relevant to the aryl group.

In some embodiments, the heteroaryl group may be a five-membered or six-membered aromatic heterocyclic ring system carrying the independent groups containing 0, 1, or 2 substituent groups. A typical example of the heteroaryl group includes, but is not limited to unsubstituted furan, benzofuran, thiophene, benzothiophene, pyrrole, pyridine, indole, azole, benzoxazole, isoxazole, benzoisoxazole, thiazole, benzothiazole, isothiazole, imidazole, benzimidazole, pyrazole, indazole, tetrazole, quinoline, isoquinoline, pyridazine, pyrimidine, purine and pyrazine, furan, 1,2,3-diazole, 1,2,3-thiadiazole, 1,2,4-thiadiazole, triazole, benzotriazole, pteridine, benzoxazole, diazole, benzopyrazole, quinolizine, cinnoline, phthalazine, quinazol and quinoxaline and their mono-substituted or di-substituted derivatives. In some embodiments, the substituent group is a halogeno group, a hydroxyl group, a cyano group, a $O-C_{1-6}$ alkyl group, a $C_{1-6}$ alkyl group, a hydroxyl $C_{1-6}$ alkyl group, and an amino-$C_{1-6}$ alkyl group.

Specific examples shown below include but are not limited to the following structures:

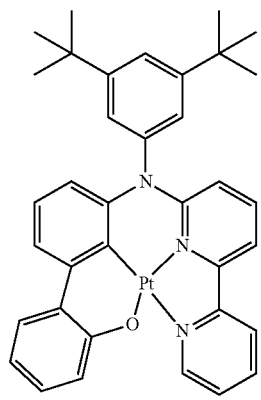

P1

-continued
P2
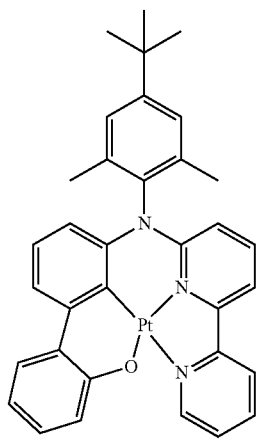
P3
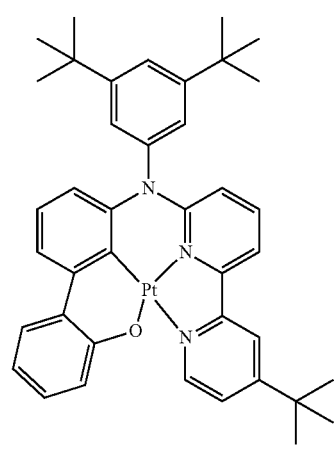
P4
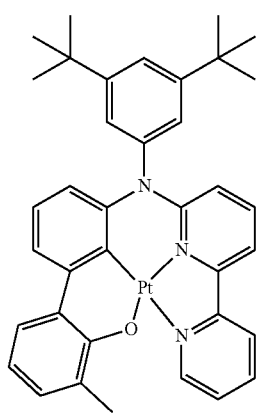
P5
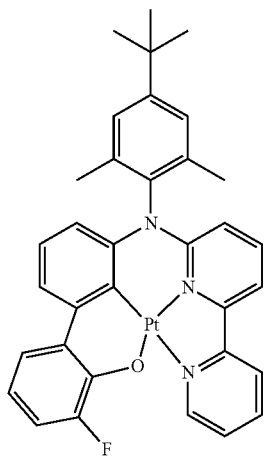
P6
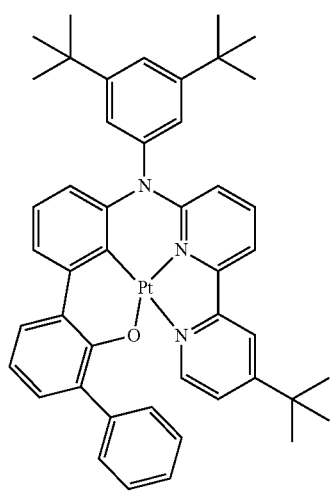
P7
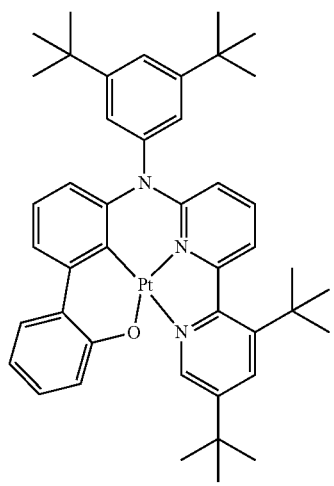

P8 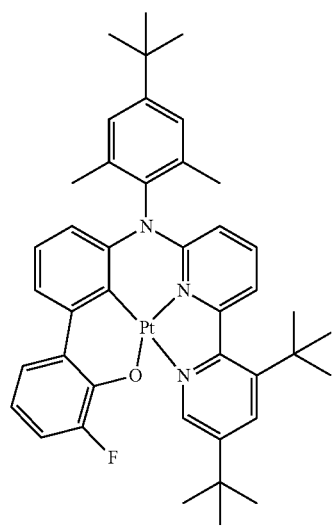
P9 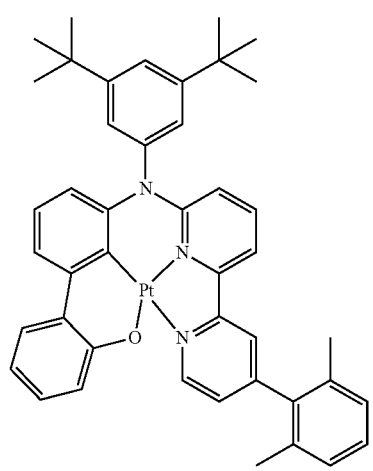
P10 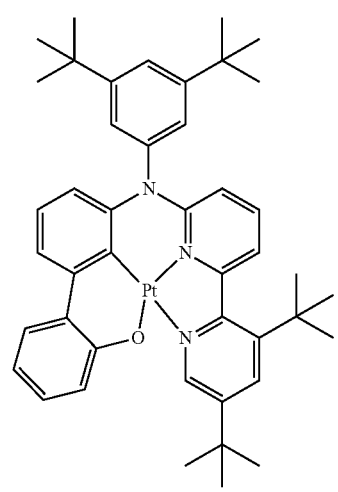
P11 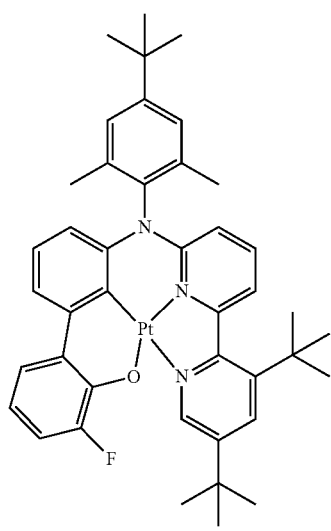
P12 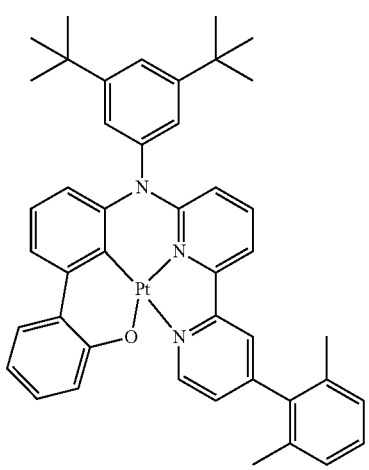
P13 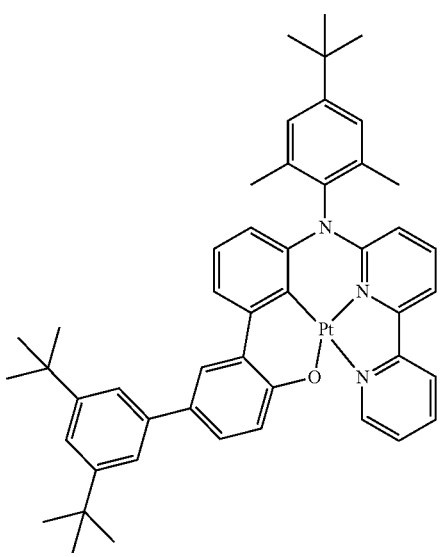

P14
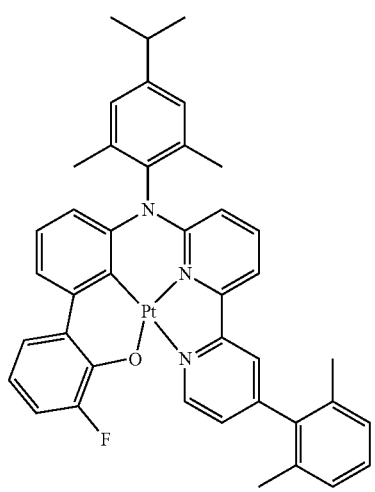
P15
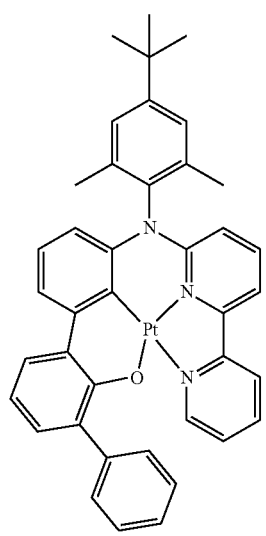
P16
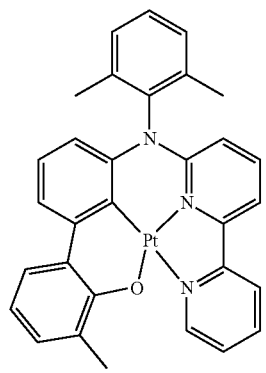
P17
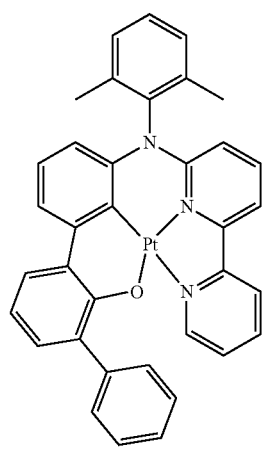
P18
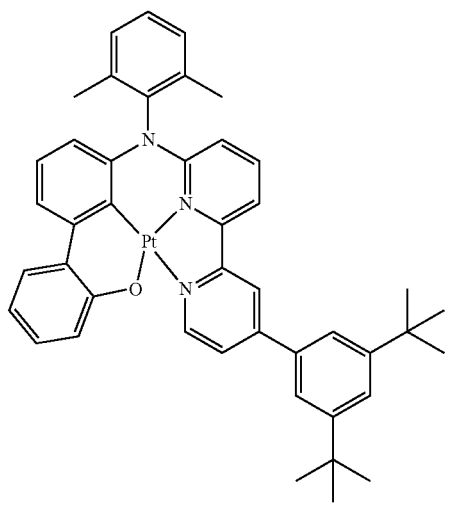
P19
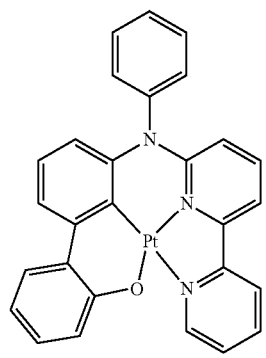

P20
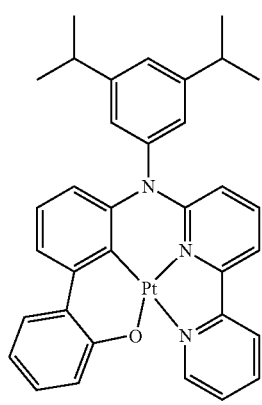
P21
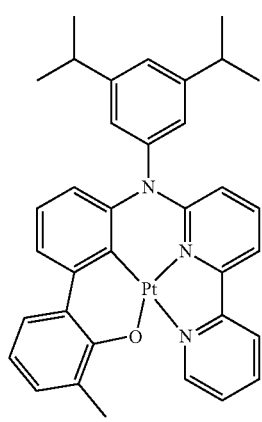
P22
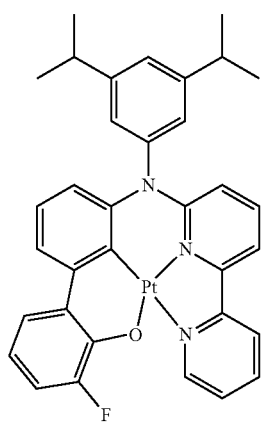
P23
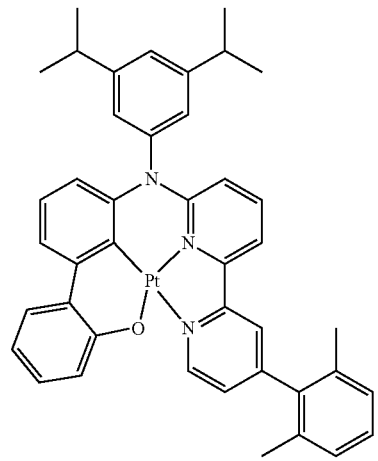
P24
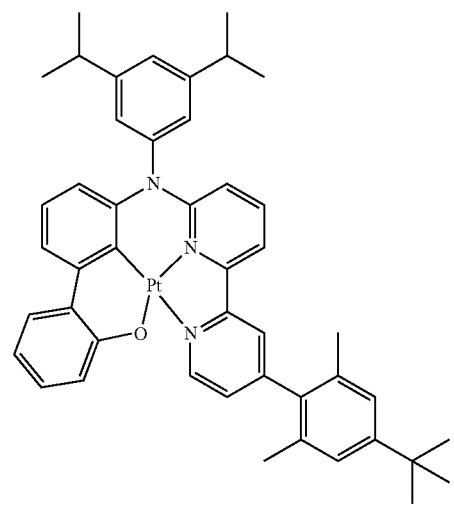
P25
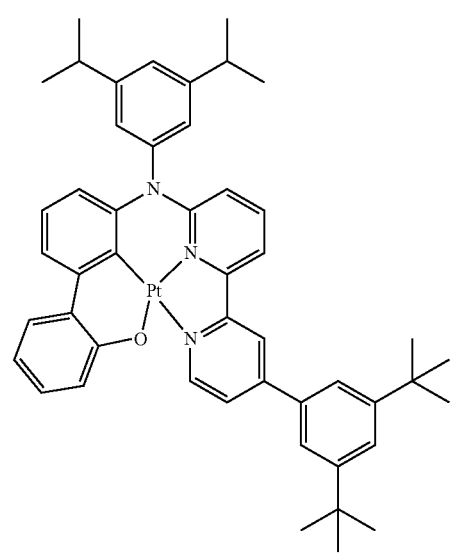

P26
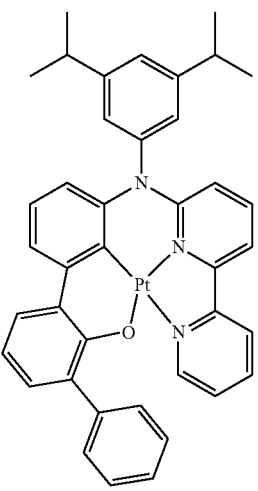
P27
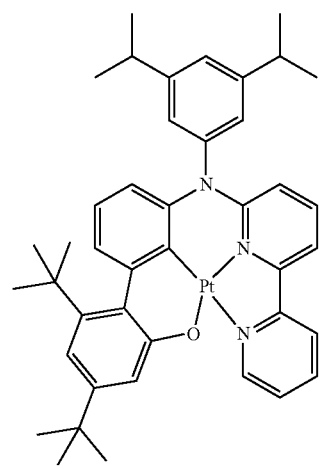
P28
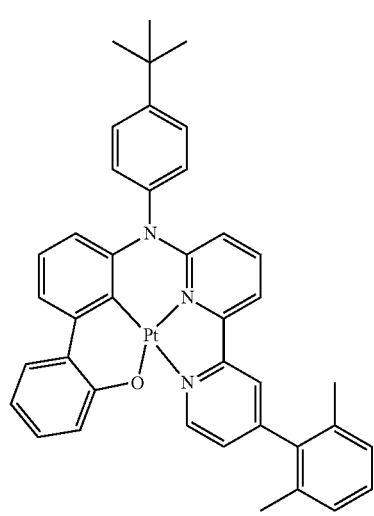
P29
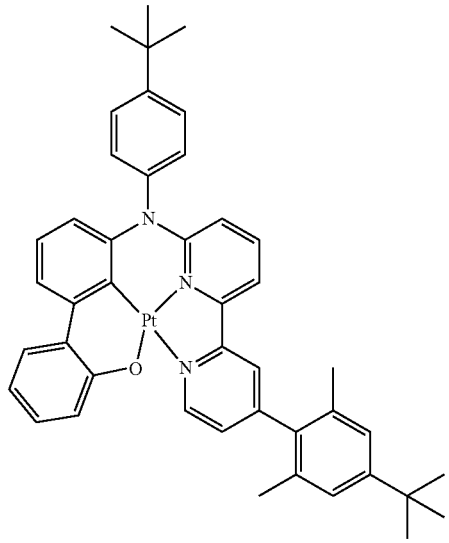
P30
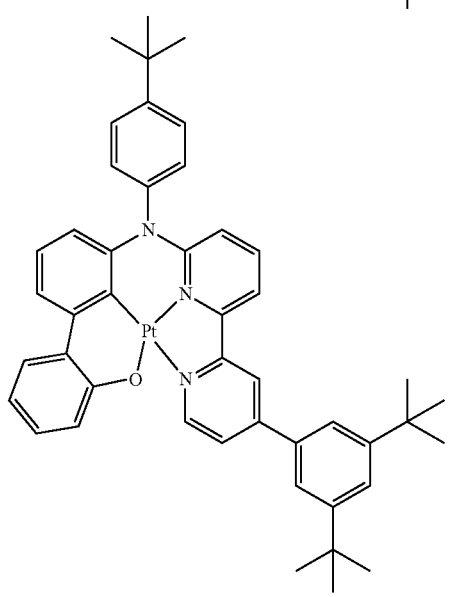
P31
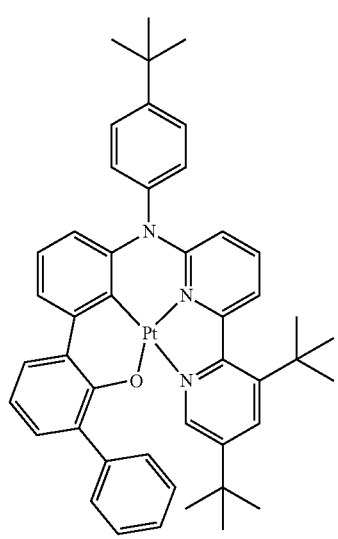

P32
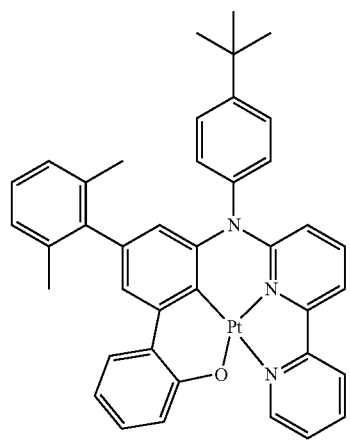
P35
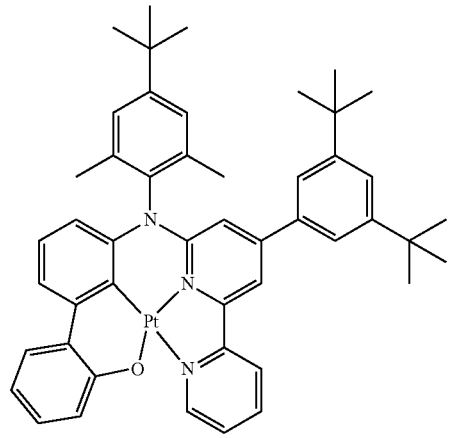
P33
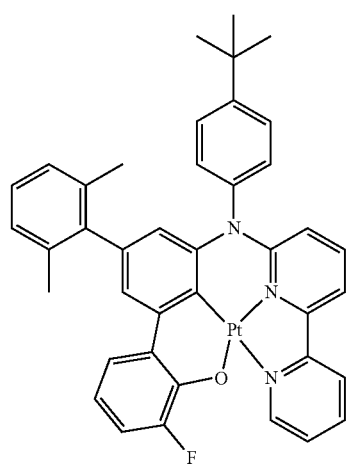
P36
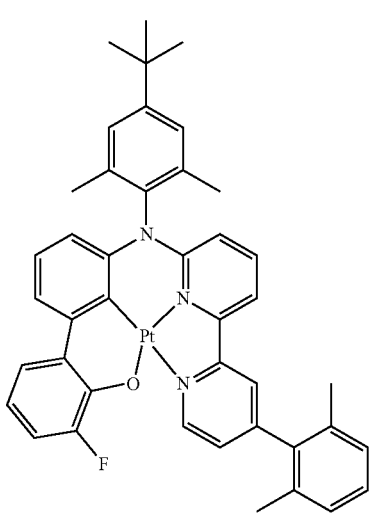
P34
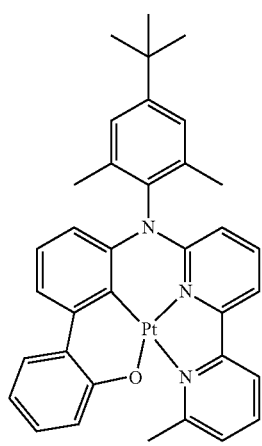
P37
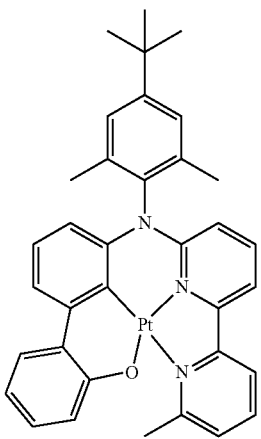

P38
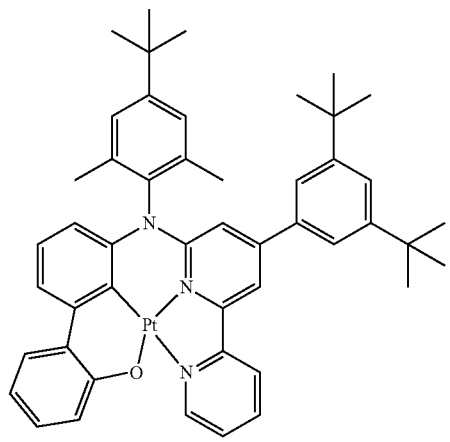
P39
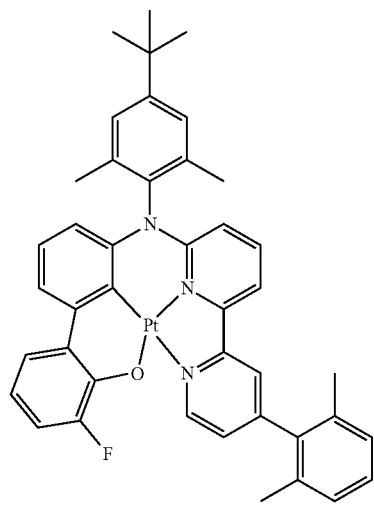
P40
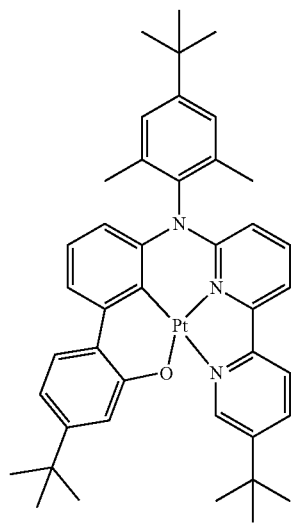
P41
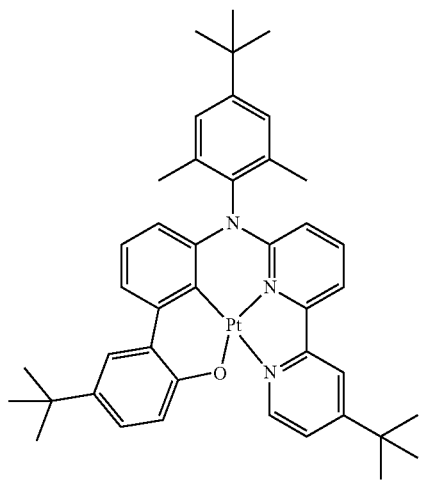
P42
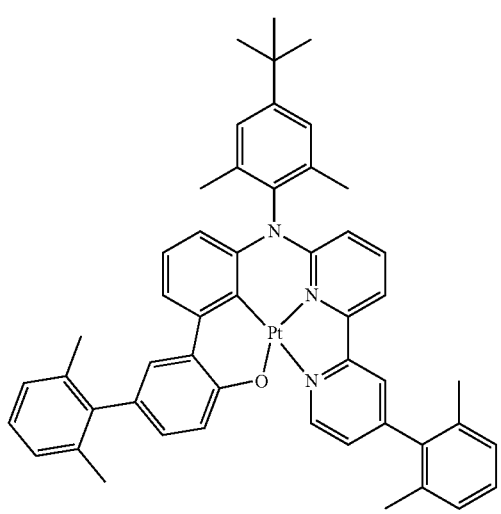
P43
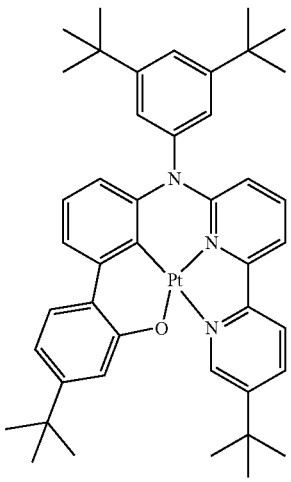

P44

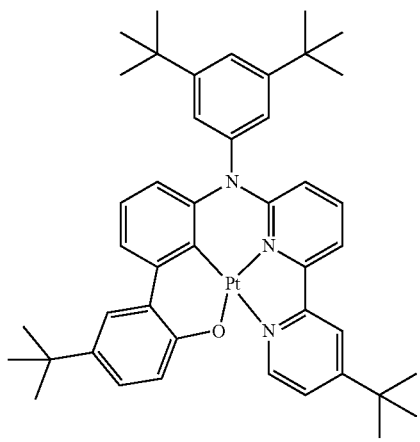

P45

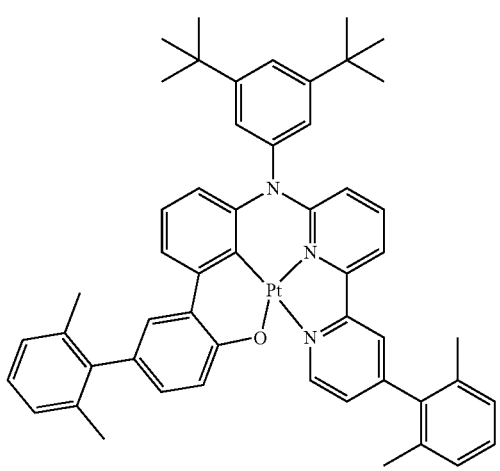

A structural formula of a precursor, i.e., a ligand, of the above complex is as follows:

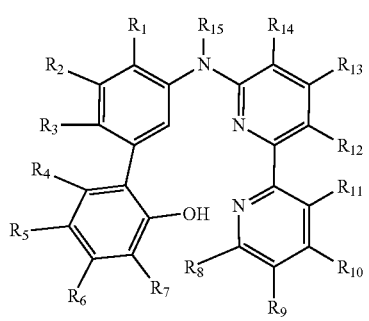

wherein $R_1$ to $R_{15}$ are independently selected from hydrogen, halogen, an amino group, a nitryl group, a cyano group, a diarylamine group, a saturated alkyl group containing 1 to 10 carbon atoms, an aryl group containing 5 to 20 carbon atoms and unsubstituted or substituted by halogen or one or more C1 to C4 alkyl groups, or a heteroaryl group containing 5 to 20 carbon atoms and unsubstituted or substituted by halogen or one or more C1 to C4 alkyl groups, or adjacent $R_1$ to $R_{15}$ are connected to each other by a covalent bond to form a ring.

Preferably,

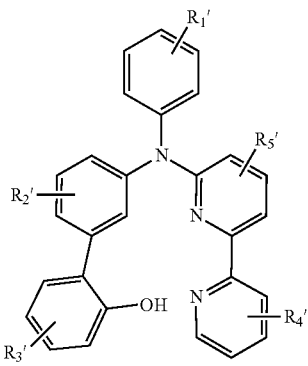

wherein $R_1'$ to $R_5'$ are independently selected from hydrogen, halogen, a diarylamine group, a saturated alkyl group containing 1 to 10 carbon atoms, an aryl group containing 5 to 20 carbon atoms and unsubstituted or substituted by halogen or one or more C1 to C4 alkyl groups, or a heteroaryl group containing 5 to 20 carbon atoms and unsubstituted or substituted by halogen or one or more C1 to C4 alkyl groups, or adjacent $R_1'$ to $R_5'$ are connected to each other by a covalent bond to form a ring, wherein the halogen is F, Cl or Br.

Application of the complex to an OLED light-emitting device is provided.

By using the platinum (II) complex having the above structure, a thermal deposition and solution treatment OLED device can be manufactured.

An organic light-emitting device containing one or more of the above complexes is included.

The complex is applied in a layer form in the device through thermal deposition.

The complex is applied in a layer form in the device through spin coating.

The complex is applied in a layer form in the device through inkjet printing.

The organic light-emitting device emits orange-red light when current is applied.

The organic metal complex in the present invention has the advantages high fluorescence quantum efficiency, high thermal stability and low quenching constant, and can be used to manufacture orange-red light OLED devices with high luminous efficiency and low roll-off.

BRIEF DESCRIPTION OF THE DRAWINGS

FIG. 1 is a schematic structure diagram of an organic electroluminescence device of the present invention.

DETAILED DESCRIPTION OF THE EMBODIMENTS

The present invention will be further illustrated in detail in conjunction with Embodiments hereafter.

A preparation method of the complex includes the following steps:

As shown below, initial substrates S1 and S2 take a Buchwald-Hartwig coupling reaction to obtain a substrate S3. The S3 and S4 take a Buchwald-Hartwig coupling reaction to obtain a substrate S5. The S5 is subjected to demethylation under the effect of pyridine hydrochlorides to obtain S6. The S6 takes a reaction with $K_2PtCl_4$ to obtain a target product P.

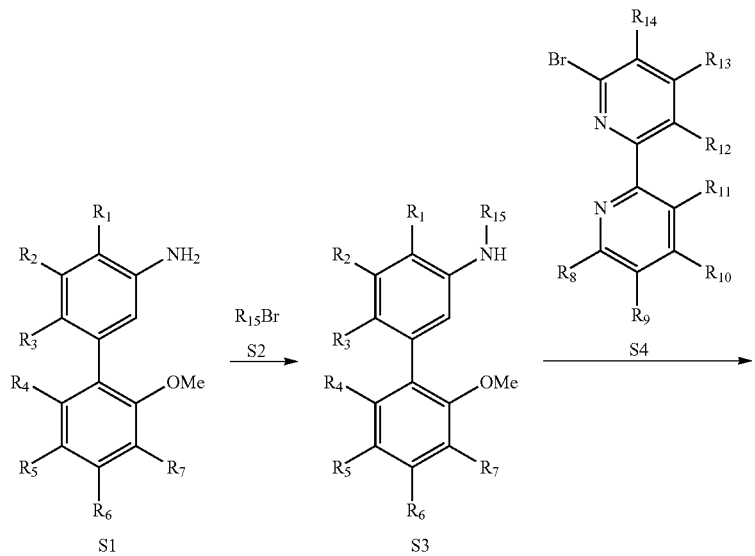
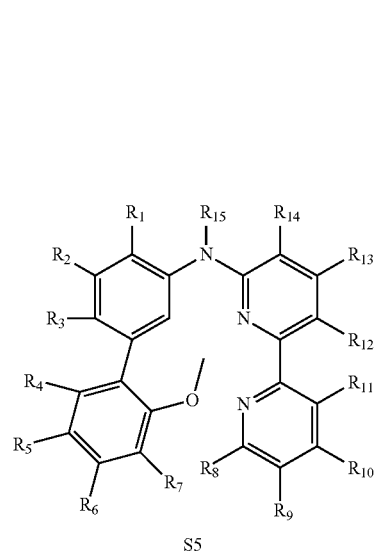
Initial substrates and solvents used in the compound synthesis of the present invention were purchased from suppliers known to those skilled in the art, such as Energy, J&K and Aladdin.
Embodiment 1
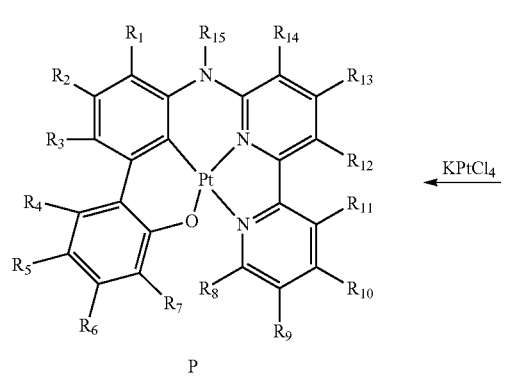
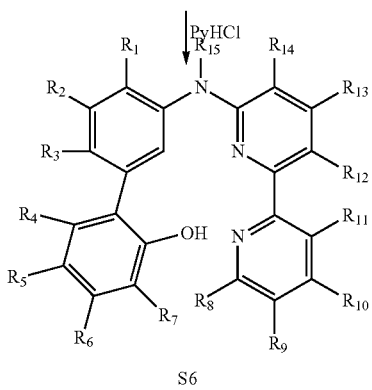
-continued
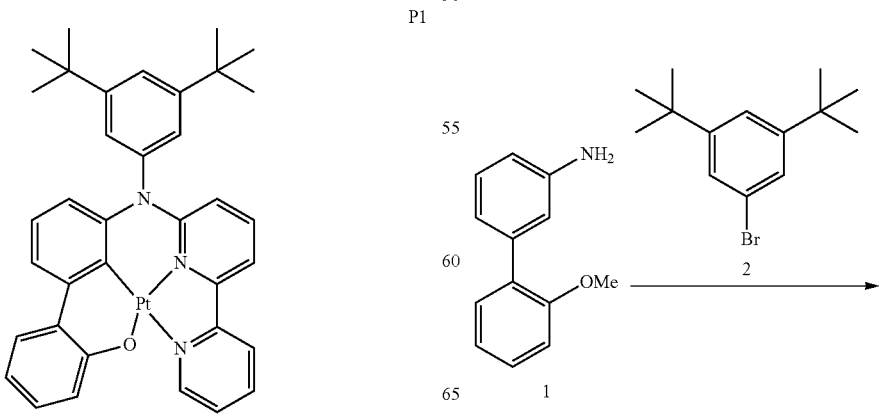

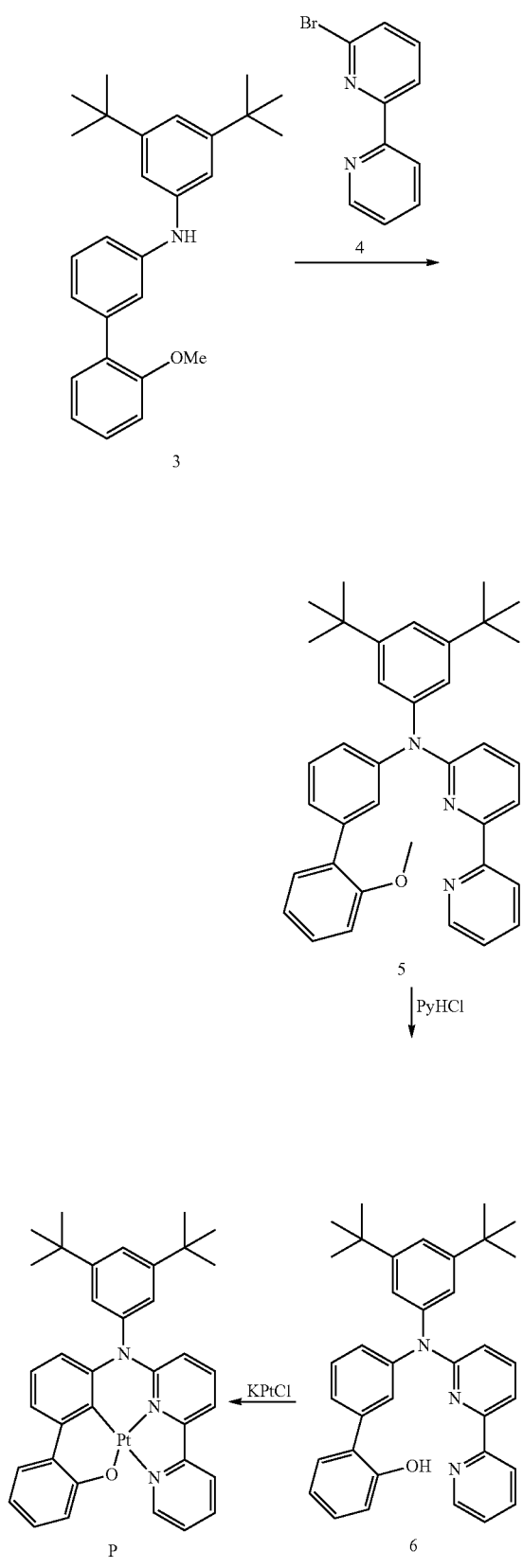

Synthesis of Compound 3: 19.92 g (0.10 mmol) of Compound 1, 26.92 g (0.10 mol) of Compound 2, 450 mg of palladium acetate (0.02 eq., 2 mmol), 1.05 g of triphenylphosphine (0.04 eq., 4 mmol) and 22.44 g of potassium tert-butoxide (2.0 eq., 0.20 mol) were taken in a flask, and 200 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 32.18 g of a target product of Compound 3, the yield was 90%, and the purity was 99.5%.

Synthesis of Compound 5: 17.88 g (50 mmol) of Compound 3, 11.75 g (50 mmol) of Compound 4, 225 mg of palladium acetate (0.02 eq., 1 mmol), 0.53 g of triphenylphosphine (0.04 eq., 2 mmol) and 11.22 g of potassium tert-butoxide (2.0 eq., 0.10 mol) were taken in a flask, and 200 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 23.83 g of a target product of Compound 5, the yield was 88%, and the purity was 99.9%.

Synthesis of Compound 6: 5.42 g (10 mmol) of Compound 5 and 30 g of pyridine hydrochloride were taken and were heated to 200° C. under nitrogen gas protection to react for 8 hr. After the reaction was stopped, a proper amount of water and ethyl acetate were added for extraction. An organic phase was collected and dried. After the solvent removal through rotary evaporation, methanol was used for recrystallization to obtain 4.48 g of a target product of Compound 6, the yield was 85%, and the purity was 99.9%. Mass spectrum: (ESI$^-$)([M-H]$^-$). $C_{36}H_{37}N_3O$ theoretical value: 526.29. Measured value: 526.26.

Synthesis of Compound P1: 1.06 g (2.0 mmol) of Compound 6, 160 mg of tetrabutylammonium bromide (0.25 eq., 0.5 mmol) and 930 mg of potassium chloroplatinate (1.2 eq., 2.4 mmol) were taken, and dissolved in 25 mL of acetic acid. Vacuum pumping was performed, and nitrogen gas was introduced for replacement for many times. Heating was performed under stirring to reach 130° C. for reaction for 12 hr. After the reaction was completed, cooling and rotary evaporation were performed to remove a solvent. Then, a proper amount of water and ethyl acetate were added for extraction, and an organic phase was collected. After drying by using anhydrous magnesium sulfate, rotary evaporation was performed to remove a solvent. A n-hexane/ethyl acetate system was used for column chromatography. An obtained crude product was subjected to vacuum sublimation to obtain 648 mg of red solids, the total yield was 45%, and the purity was 99.9%. Mass spectrum: (ESI$^-$)([M-H]$^-$). $C_{36}H_{34}N_3OPt$ theoretical value: 719.24. Measured value: 719.23.

Embodiment 2
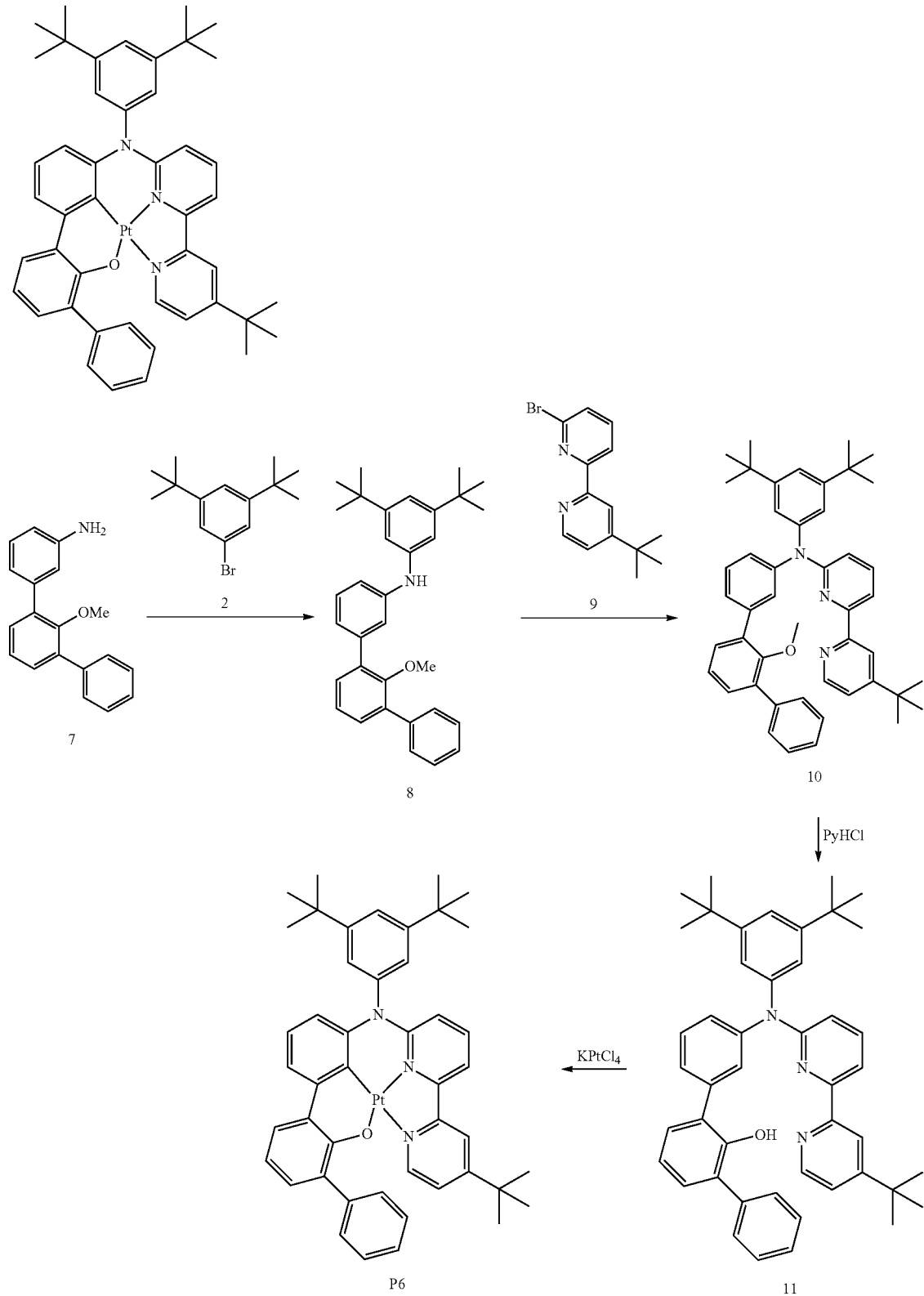

Synthesis of Compound 8: 27.53 g (0.10 mmol) of Compound 7, 26.92 g (0.10 mol) of Compound 2, 450 mg of palladium acetate (0.02 eq., 2 mmol), 1.05 g of triphenylphosphine (0.04 eq., 4 mmol) and 22.44 g of potassium tert-butoxide (2.0 eq., 0.20 mol) were taken in a flask, and 250 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 40.82 g of a target product of Compound 8, the yield was 88%, and the purity was 99.5%.

Synthesis of Compound 10: 23.18 g (50 mmol) of Compound 8, 14.56 g (50 mmol) of Compound 9, 225 mg of palladium acetate (0.02 eq., 1 mmol), 0.53 g of triphenylphosphine (0.04 eq., 2 mmol) and 11.22 g of potassium tert-butoxide (2.0 eq., 0.10 mol) were taken in a flask, and 200 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 30.32 g of a target product of Compound 10, the yield was 90%, and the purity was 99.9%.

Synthesis of Compound 11: 6.74 g (10 mmol) of Compound 10 and 40 g of pyridine hydrochloride were taken and were heated to 200° C. under nitrogen gas protection to react for 8 hr. After the reaction was stopped, a proper amount of water and ethyl acetate were added for extraction. An organic phase was collected and dried. After the solvent removal through rotary evaporation, methanol was used for recrystallization to obtain 5.28 g of a target product of Compound 11, the yield was 80%, and the purity was 99.9%. Mass spectrum: (ESI$^-$)([M-H]$^-$). $C_{46}H_{48}N_3O$ theoretical value: 658.39. Measured value: 658.37.

Synthesis of Compound P6: 1.32 g (2.0 mmol) of Compound 11, 160 mg of tetrabutylammonium bromide (0.25 eq., 0.5 mmol) and 930 mg of potassium chloroplatinate (1.2 eq., 2.4 mmol) were taken, and dissolved in 25 mL of acetic acid. Vacuum pumping was performed, and nitrogen gas was introduced for replacement for many times. Heating was performed under stirring to reach 130° C. for reaction for 12 hr. After the reaction was completed, cooling and rotary evaporation were performed to remove a solvent. Then, a proper amount of water and ethyl acetate were added for extraction, and an organic phase was collected. After drying by using anhydrous magnesium sulfate, rotary evaporation was performed to remove a solvent. A n-hexane/ethyl acetate system was used for column chromatography. An obtained crude product was subjected to vacuum sublimation to obtain 716 mg of red solids, the total yield was 42%, and the purity was 99.9%. Mass spectrum: (ESI$^-$)([M-H]$^-$). $C_{46}H_{46}N_3OPt$ theoretical value: 851.34. Measured value: 851.32.

Embodiment 3

P24

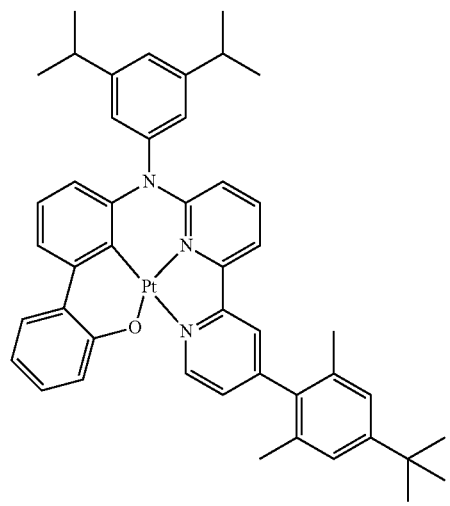

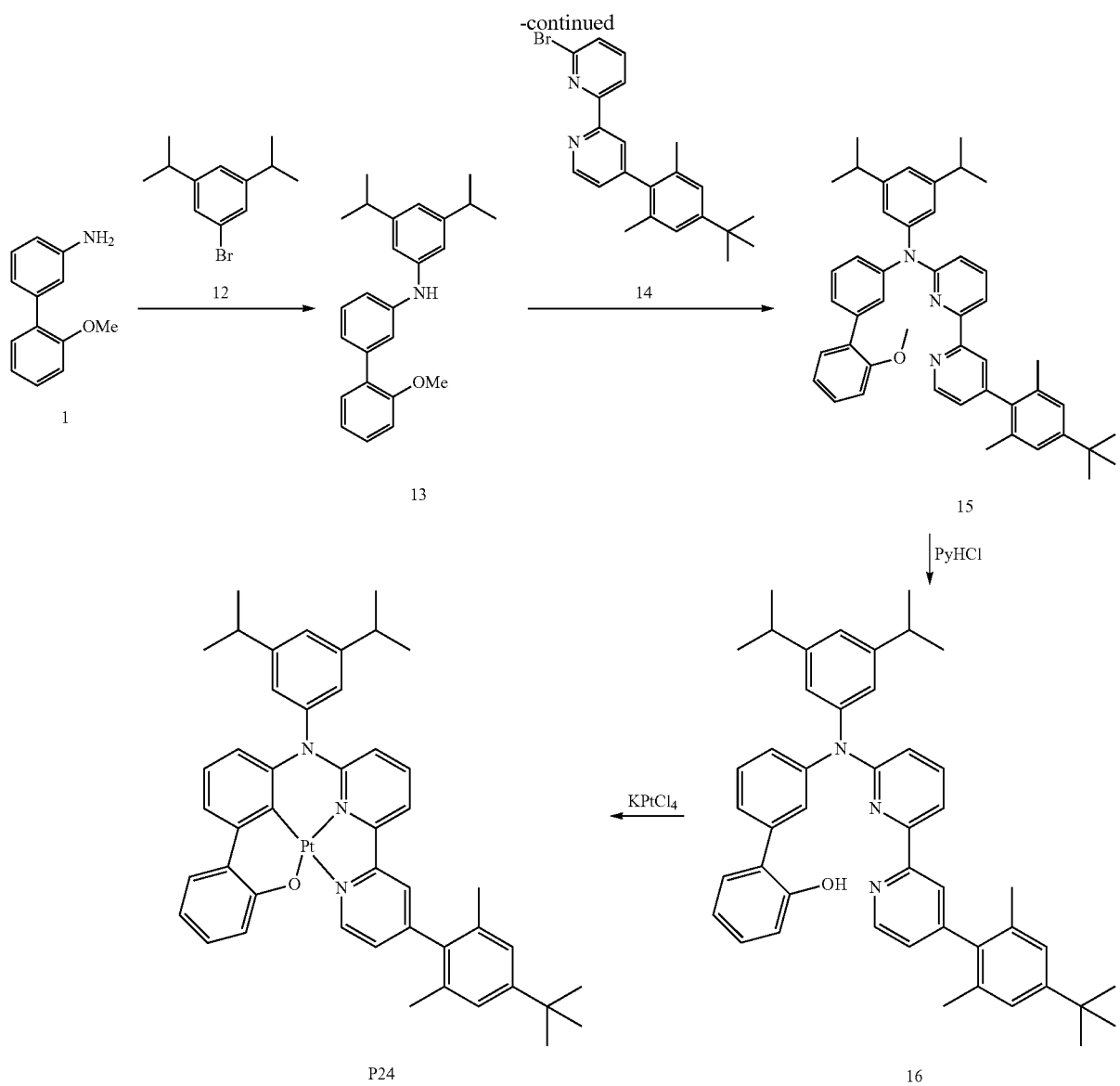

Synthesis of Compound 13: 19.92 g (0.10 mmol) of Compound 1, 24.12 g (0.10 mol) of Compound 12, 450 mg of palladium acetate (0.02 eq., 2 mmol), 1.05 g of triphenylphosphine (0.04 eq., 4 mmol) and 22.44 g of potassium tert-butoxide (2.0 eq., 0.20 mol) were taken in a flask, and 250 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 32.36 g of a target product of Compound 13, the yield was 90%, and the purity was 99.5%.

Synthesis of Compound 15: 17.98 g (50 mmol) of Compound 13, 19.78 g (50 mmol) of Compound 14, 225 mg of palladium acetate (0.02 eq., 1 mmol), 0.53 g of triphenylphosphine (0.04 eq., 2 mmol) and 11.22 g of potassium tert-butoxide (2.0 eq., 0.10 mol) were taken in a flask, and 250 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 28.64 g of a target product of Compound 15, the yield was 85%, and the purity was 99.9%.

Synthesis of Compound 16: 6.74 g (10 mmol) of Compound 15 and 40 g of pyridine hydrochloride were taken and were heated to 200° C. under nitrogen gas protection to react for 8 hr. After the reaction was stopped, a proper amount of water and ethyl acetate were added for extraction. An organic phase was collected and dried. After the solvent removal through rotary evaporation, methanol was used for recrystallization to obtain 5.61 g of a target product of Compound 16, the yield was 85%, and the purity was 99.9%. Mass spectrum: (ESI⁻)([M-H]⁻). $C_{46}H_{48}N_3O$ theoretical value: 658.39. Measured value: 658.37.

Synthesis of Compound P24: 1.32 g (2.0 mmol) of Compound 16, 160 mg of tetrabutylammonium bromide (0.25 eq., 0.5 mmol) and 930 mg of potassium chloroplatinate (1.2 eq., 2.4 mmol) were taken, and dissolved in 25 mL of acetic acid. Vacuum pumping was performed, and nitrogen gas was introduced for replacement for many times. Heating was performed under stirring to reach 130° C. for reaction for 12 hr. After the reaction was completed, cooling and rotary evaporation were performed to remove a solvent. Then, a proper amount of water and ethyl acetate were added for extraction, and an organic phase was collected. After drying by using anhydrous magnesium sulfate, rotary evaporation was performed to remove a solvent. A n-hexane/ethyl acetate system was used for column chromatography. An obtained crude product was subjected to vacuum sublimation to obtain 682 mg of red solids, the total yield was 40%, and the purity was 99.9%. Mass spectrum: (ESI$^-$)([M-H]$^-$). $C_{46}H_{46}N_3OPt$ theoretical value: 851.34. Measured value: 851.32.

Embodiment 4

P45

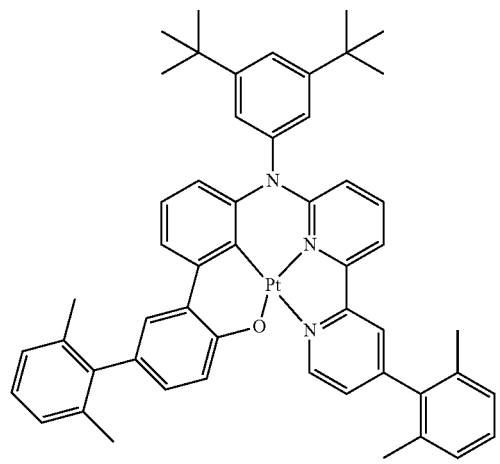

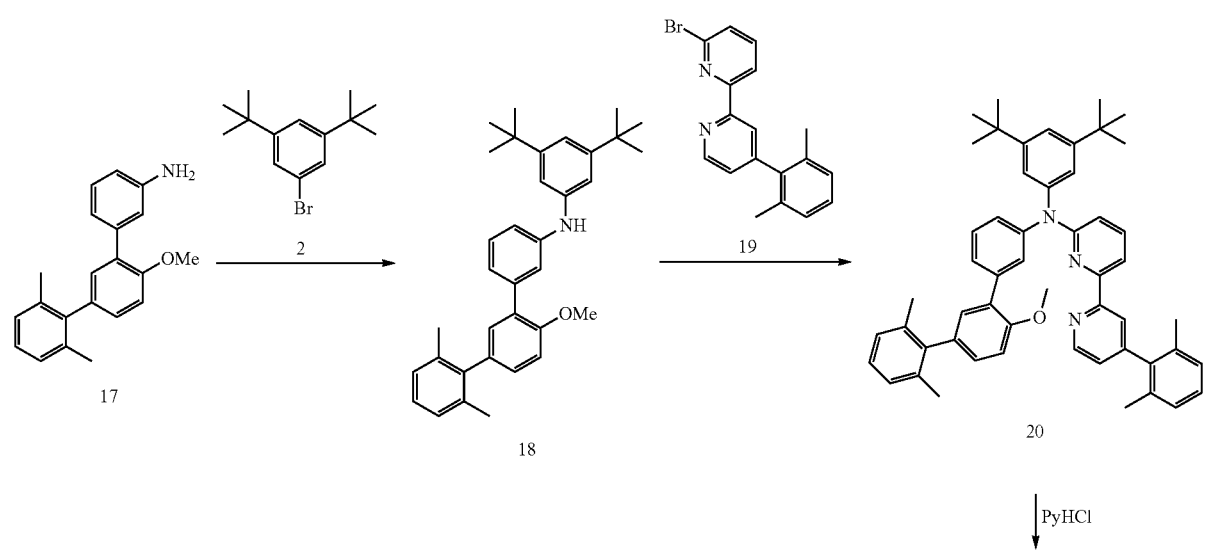

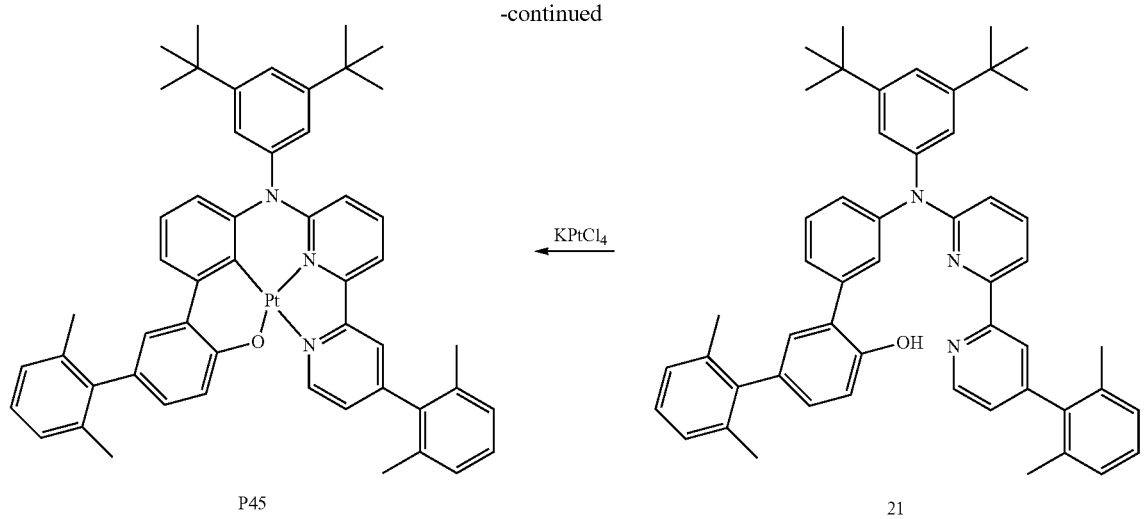

P45 ←KPtCl₄ 21

Synthesis of Compound 18: 30.34 g (0.10 mmol) of Compound 17, 26.92 g (0.10 mol) of Compound 2, 450 mg of palladium acetate (0.02 eq., 2 mmol), 1.05 g of triphenylphosphine (0.04 eq., 4 mmol) and 22.44 g of potassium tert-butoxide (2.0 eq., 0.20 mol) were taken in a flask, and 300 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 44.25 g of a target product of Compound 18, the yield was 90%, and the purity was 99.5%.

Synthesis of Compound 20: 25.58 g (50 mmol) of Compound 18, 16.96 g (50 mmol) of Compound 19, 225 mg of palladium acetate (0.02 eq., 1 mmol), 0.53 g of triphenylphosphine (0.04 eq., 2 mmol) and 11.22 g of potassium tert-butoxide (2.0 eq., 0.10 mol) were taken in a flask, and 300 mL of dioxane was added for heating reflux reaction for 8 hr under nitrogen gas protection. After the reaction was stopped, cooling was performed to reach a room temperature, and rotary evaporation was performed to remove a solvent. A proper amount of water and ethyl acetate were added for extraction. An organic phase was collected and dried. After the solvent removal through rotary evaporation, methanol was used for recrystallization to obtain 30.75 g of a target product of Compound 20, the yield was 82%, and the purity was 99.9%.

Synthesis of Compound 21: 7.50 g (10 mmol) of Compound 20 and 50 g of pyridine hydrochloride were taken and were heated to 200° C. under nitrogen gas protection to react for 8 hr. After the reaction was stopped, a proper amount of water and ethyl acetate were added for extraction. An organic phase was collected and dried. After the solvent removal through rotary evaporation, methanol was used for recrystallization to obtain 5.89 g of a target product of Compound 21, the yield was 80%, and the purity was 99.9%. Mass spectrum: (ESI⁻)([M-H]⁻). $C_{52}H_{52}N_3O$ theoretical value: 734.42. Measured value: 734.40.

Synthesis of Compound P45: 1.47 g (2.0 mmol) of Compound 21, 160 mg of tetrabutylammonium bromide (0.25 eq., 0.5 mmol) and 930 mg of potassium chloroplatinate (1.2 eq., 2.4 mmol) were taken, and dissolved in 25 mL of acetic acid. Vacuum pumping was performed, and nitrogen gas was introduced for replacement for many times. Heating was performed under stirring to reach 130° C. for reaction for 12 hr. After the reaction was completed, cooling and rotary evaporation were performed to remove a solvent. Then, a proper amount of water and ethyl acetate were added for extraction, and an organic phase was collected. After drying by using anhydrous magnesium sulfate, rotary evaporation was performed to remove a solvent. A n-hexane/ethyl acetate system was used for column chromatography. An obtained crude product was subjected to vacuum sublimation to obtain 780 mg of red solids, the total yield was 42%, and the purity was 99.9%. Mass spectrum: (ESI⁻)([M-H]⁻). $C_{50}H_{50}N_3OPt$ theoretical value: 927.37. Measured value: 927.35.

The Pt(II) complex according to the embodiment showed obvious orange red light emission in a dichloromethane solution, as shown in the following table.

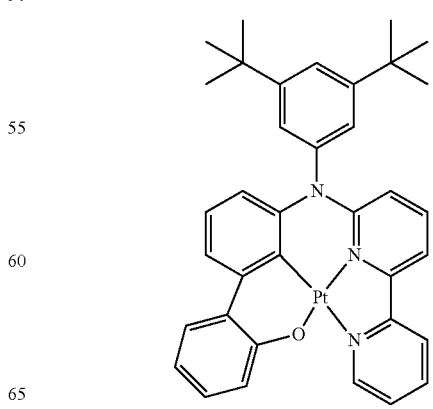

P1

-continued

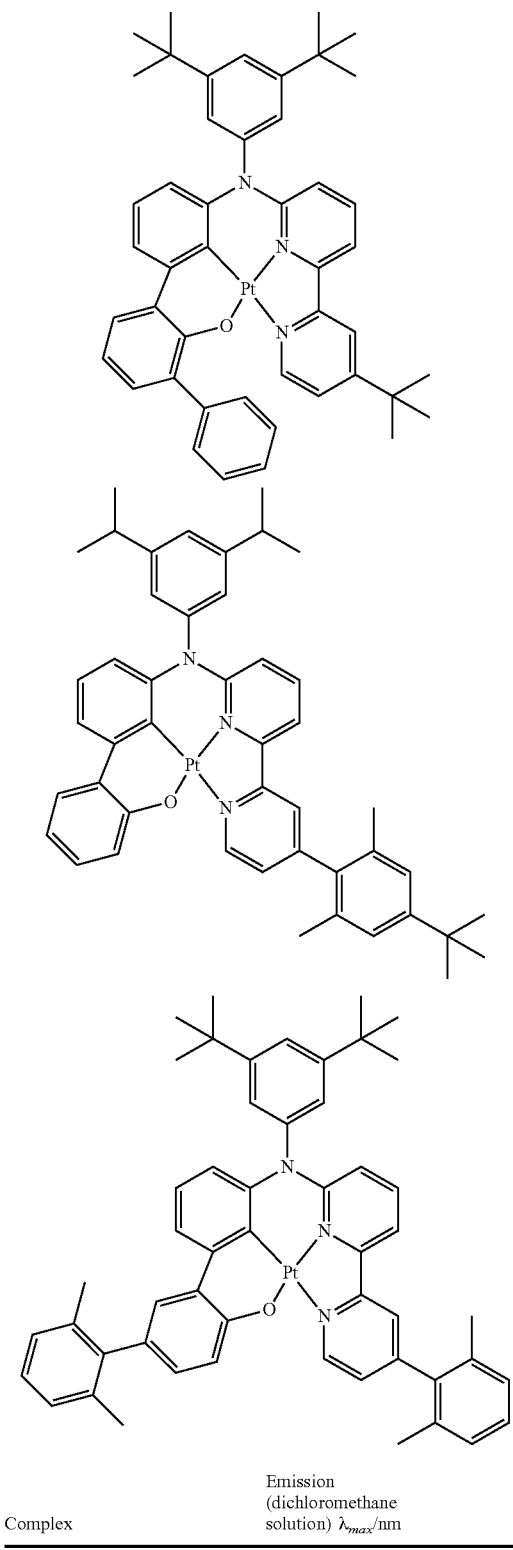

| Complex | Emission (dichloromethane solution) $\lambda_{max}$/nm |
|---|---|
| P1 | 605 |
| P6 | 606 |
| P24 | 608 |
| P45 | 607 |

Application examples of the compound of the present invention are provided hereafter. ITO/TAPC (60 nm)/TCTA: Pt(II)(40 nm)/TmPyPb (30 nm)/LiF (1 nm)/Al (80 nm)

Preparation Mode of Device:

A transparent anodized tin indium tin (ITO, 20) (10 Ω/sq) glass substrate 10 was ultrasonically cleaned by using acetone, ethanol and distilled water in sequence, and was then subjected to plasma treatment for 5 minutes by using oxygen gas.

Next, the ITO substrate was mounted on a substrate holder of vacuum vapor deposition equipment. In the evaporation equipment, a system pressure was controlled at $10^{-6}$ torr.

Then, a hole transport layer (30) material TAPC with a thickness of 60 nm was evaporated onto the ITO substrate.

Then, a light-emitting layer material (40) TCTA with a thickness of 40 nm was evaporated, and platinum (II) complex dopants in different mass percentage were doped.

Then, an electron transport layer (50) material TmPyPb with a thickness of 30 nm was evaporated.

Then, LiF with a thickness of 1 nm was evaporated as an electron injection layer (60).

Finally, Al with a thickness of 80 nm was evaporated as a cathode (70), and device packaging was completed, as shown in FIG. 1.

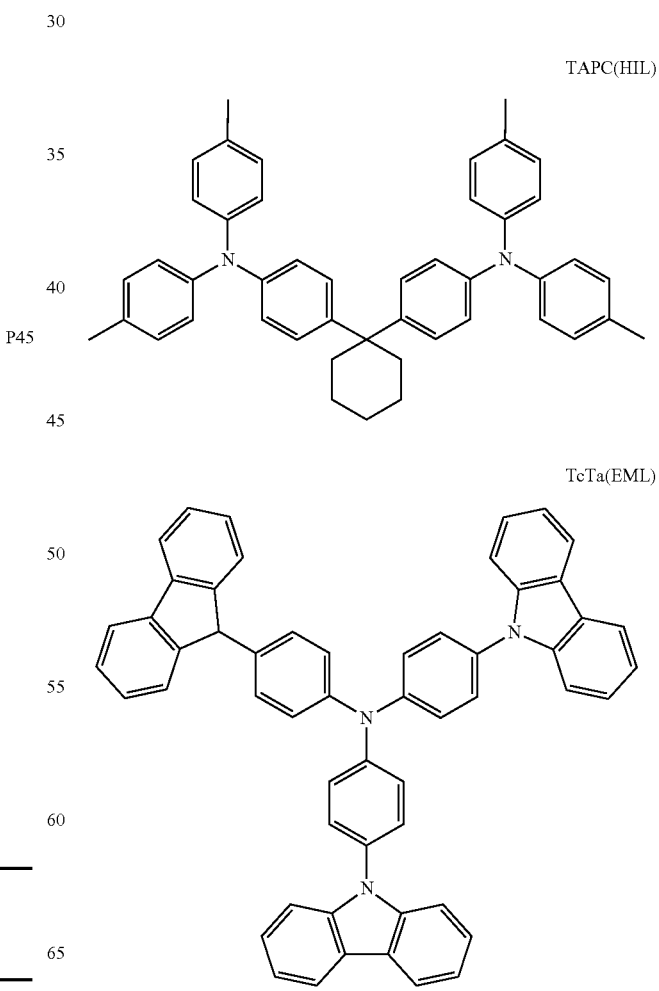

-continued

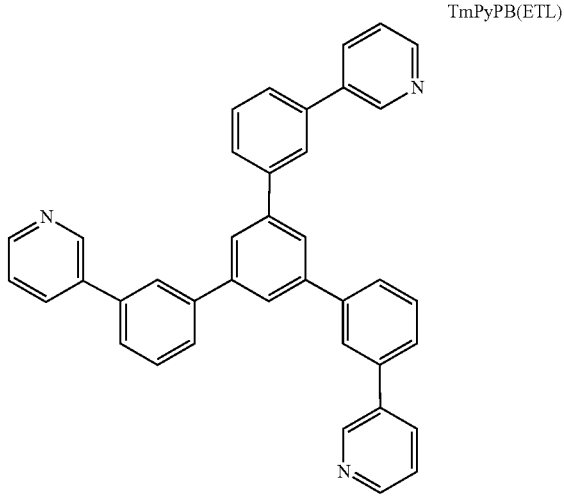
TmPyPB(ETL)

The structures and manufacturing methods of the device were completely identical, the differences were that the organic metal complexes P0, P1, P6, P24 and P45 were sequentially used as the dopants in the light-emitting layer, and the doping concentrations were different. Pt0 is a classic O^N^N^O type red light material.

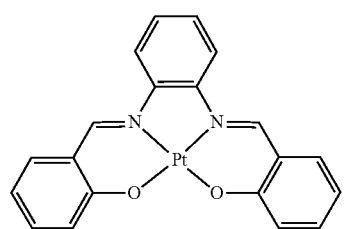
P0

Device comparative results were as shown in the following table:

| Doping concentration | Pt(II) complex | $V_{on}$ (V) | CE (cd/A) | PE (lm/W) | EQE (%) |
|---|---|---|---|---|---|
| | | | at 1000 cd/A | | |
| 4 wt % | P0 | 3.4 | 69.4 | 60.5 | 14.0 |
| | P1 | 3.1 | 73.6 | 65.4 | 16.8 |
| | P6 | 3.0 | 74.1 | 66.2 | 17.0 |
| | P24 | 3.0 | 75.5 | 67.8 | 17.6 |
| | P45 | 3.0 | 77.0 | 70.5 | 18.9 |
| 8 wt % | P0 | 3.4 | 68.2 | 59.8 | 13.6 |
| | P1 | 3.1 | 74.8 | 68.7 | 17.6 |
| | P6 | 3.0 | 76.8 | 71.5 | 18.5 |
| | P24 | 3.0 | 78.7 | 73.2 | 19.2 |
| | P45 | 3.0 | 77.0 | 75.5 | 21.2 |
| 12 wt % | P0 | 3.4 | 66.8 | 58.2 | 13.0 |
| | P1 | 3.1 | 74.6 | 67.5 | 17.8 |
| | P6 | 3.0 | 77.5 | 69.2 | 19.4 |
| | P24 | 3.0 | 78.5 | 72.5 | 20.6 |
| | P45 | 3.0 | 80.6 | 75.5 | 22.6 |

Under the condition that the doping concentrations of the tetradentate platinum(II) complexes were respectively 4 wt %, 8 wt % and 12 wt %, the device was prepared by using the above ITO/HTL-1 (60 nm)/EML-1:Pt(II)(40 nm)/ETL-1 (30 nm)/LiF (1 nm)/Al (80 nm) device basic structure. By taking the performance of a device based on Pt0 as a reference, start-up voltages $V_{on}$ of the devices of the tetradentate platinum(II) complexes P1, P6, P24 and P45 were reduced to different degrees through being compared to that of the device of Pt0. At the same time, under the condition of 1000 cd/A, the current efficiency (CE), power efficiency (PE) and external quantum efficiency (EQE) of devices based on P1, P6, P24 and P45 were improved to different degrees through being compared to those of the device based on Pt-0. Particularly, the improvement of P45 in the current efficiency (CE), the power efficiency (PE) and the external quantum efficiency (EQE) was obvious. When the doping concentration of the tetradentate platinum(II) complex increased, the efficiencies of P1, P6, P24 and P45 were improved to different degrees. Compared with P1, P6, and P24, P45 had larger steric hindrance groups, so that the aggregation effect among molecules could be effectively reduced, the formation of an exciplex could be avoided, and the luminous efficiency could be improved.

According to the tetradentate platinum(II) complex provided by the present invention, the central platinum(II) is in a six-membered ring+six-membered ring+five-membered ring chelate coordination mode. The formed complex is stable, the rigid structure is strong, the non-radiative energy dissipation such as intramolecular rotation and vibration can be greatly reduced, and the luminous efficiency and performance improvement of the platinum(II) complex is facilitated. At the same time, the triphenylamine structure part in a ligand skeleton can be easily added with different substituent groups to conveniently realize the optimization and regulation of molecular structures.

Based on the above, the performance of an organic electroluminescence device prepared by the present invention is better than that of a reference device, and the related novel N^N^C^O tetradentate platinum(II) complex metal organic material has greater application values.

The invention claimed is:
1. A N^N^C^O tetradentate platinum (II) complex, having a structure as shown in the following formula:

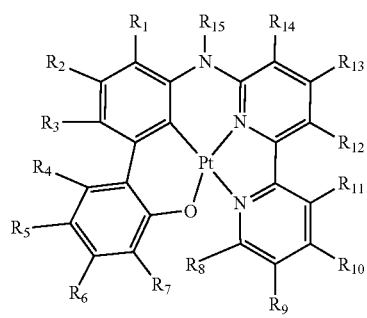

wherein:
$R_1$ to $R_{14}$ are independently selected from hydrogen, fluorine, a saturated alkyl group containing 1 to 10 carbon atoms, an aryl group containing 6 to 20 carbon atoms and unsubstituted or substituted by one or more C1 to C4 alkyl groups,
$R_{15}$ are independently selected from an aryl group containing 6 to 20 carbon atoms and unsubstituted or substituted by one or more C1 to C4 alkyl groups.
2. The complex according to claim 1, wherein:
0 to 2 of the 14 groups of $R_1$ to $R_{14}$ are independently represented as an aryl group containing 6 to 10 carbon atoms and unsubstituted or substituted by 1 to 3 C1 to C4 alkyl groups, and other groups are independently represented as hydrogen, fluorine or a saturated alkyl group containing 1 to 8 carbon atoms;

$R_{15}$ is independently represented as an aryl group containing 6 to 10 carbon atoms and unsubstituted or substituted by 1 to 3 C1 to C4 alkyl groups.

3. The complex according to claim 2, wherein:

0 to 2 of the 14 groups of $R_1$ to $R_{14}$ are independently represented as a phenyl group, and other groups are independently represented as hydrogen, fluorine or a saturated alkyl group containing 1 to 4 carbon atoms, $R_{15}$ is independently represented as a phenyl group.

4. A N^N^C^O tetradentate platinum (II) complex, having a structure as shown in the following formula:

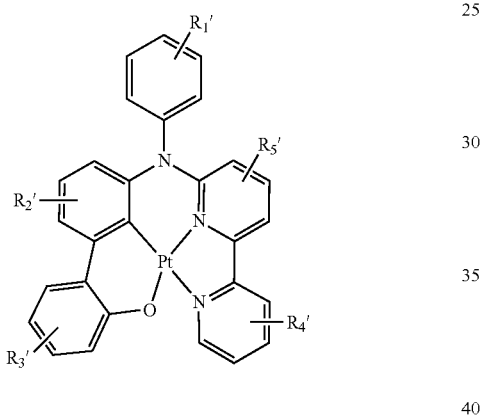

wherein:

$R_2'$ to $R_5'$ are independently selected from hydrogen, fluorine, a saturated alkyl group containing 1 to 10 carbon atoms, an aryl group containing 6 to 20 carbon atoms and unsubstituted or substituted by one or more C1 to C4 alkyl groups, $R_1'$ is independently selected from hydrogen, a saturated alkyl group containing 1 to 10 carbon atoms.

5. The complex according to claim 4, wherein:

0 to 3 of the 4 groups of $R_2'$ to $R_5'$ are independently represented as an aryl group containing 6 to 10 carbon atoms and unsubstituted or substituted by 1 to 3 C1 to C4 alkyl groups; other groups are independently represented as hydrogen, fluorine or a saturated alkyl group containing 1 to 8 carbon atoms;

$R_1'$ is independently selected from hydrogen, a saturated alkyl group containing 1 to 8 carbon atoms.

6. The complex according to claim 5, wherein:

0 to 3 of the 4 groups of $R_2'$ to $R_5'$ are independently represented as a phenyl group unsubstituted or substituted by C1 to C4 alkyl groups, and other groups are independently represented as hydrogen, fluorine or a saturated alkyl group containing 1 to 4 carbon atoms, $R_1'$ is independently selected from hydrogen, a saturated alkyl group containing 1 to 4 carbon atoms.

7. The complex according to claim 1, having one of the following structures:

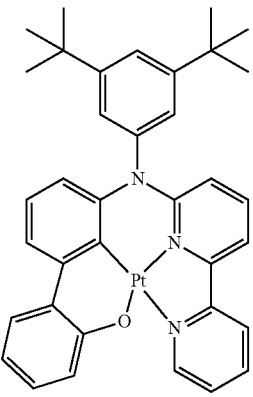

P1

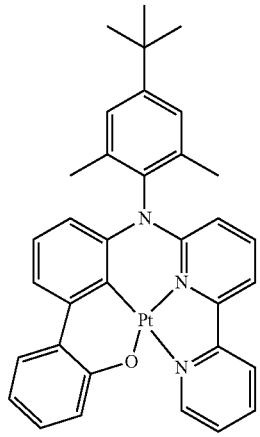

P2

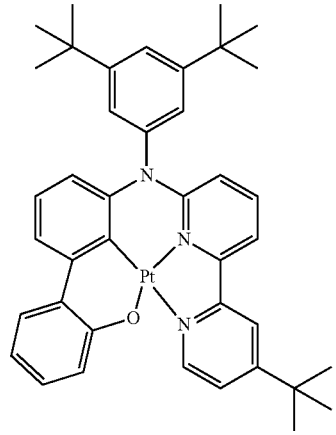

P3

P4
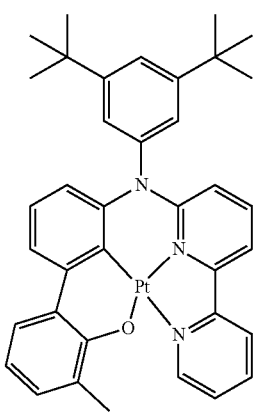
P5
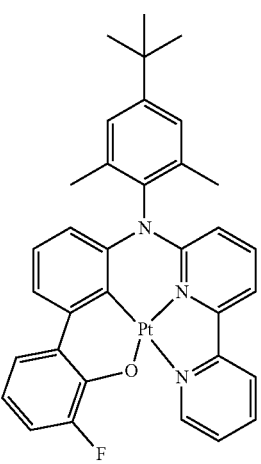
P6
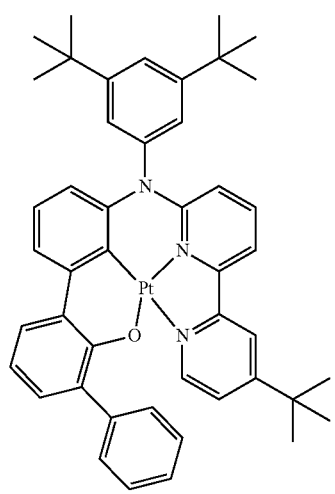
P7
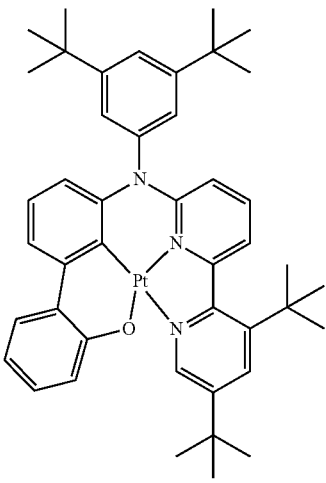
P8
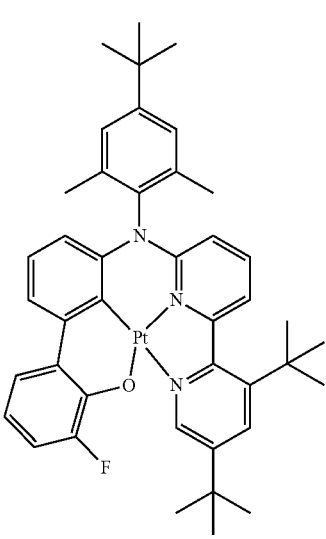
P9
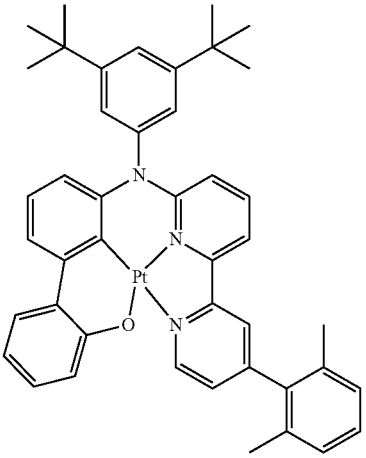

P10
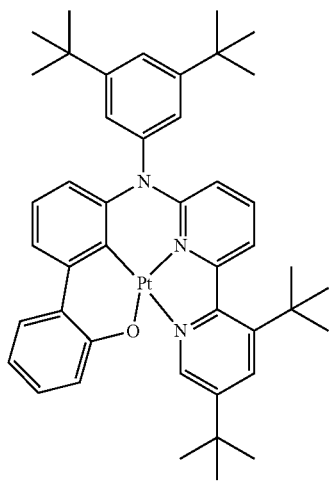
P11
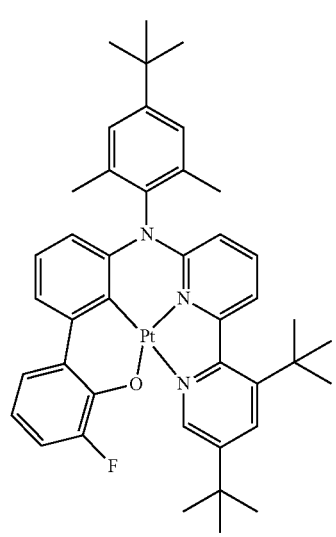
P12
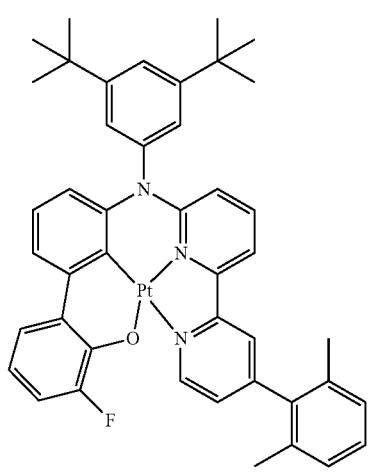
P13
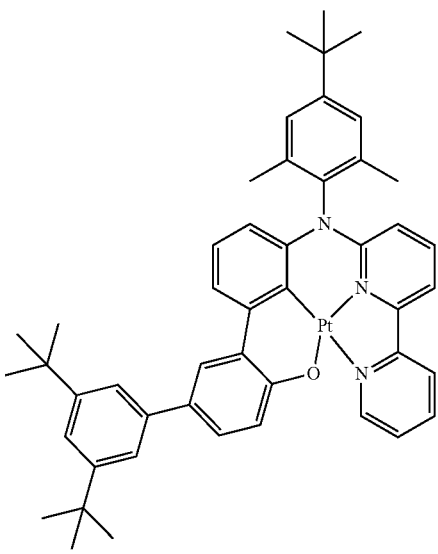
P14
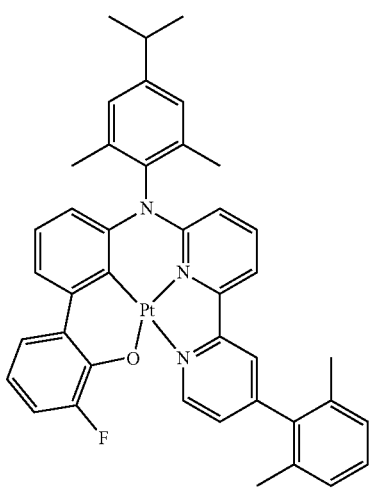
P15
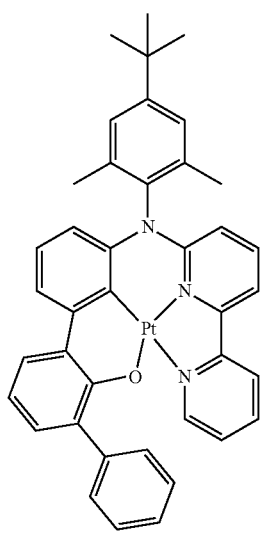

P16
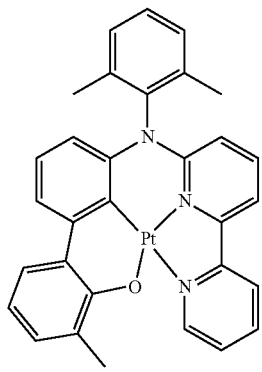
P17
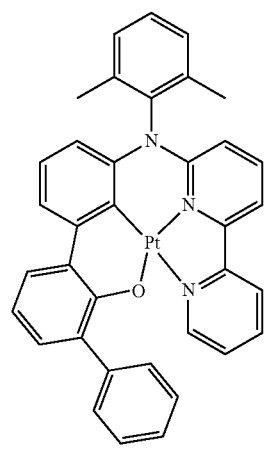
P18
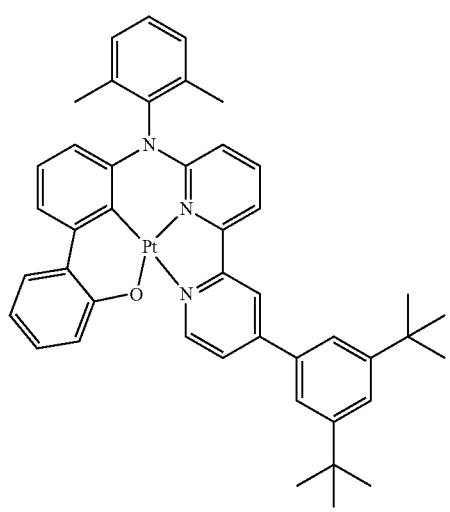
P19
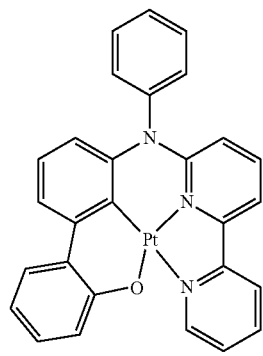
P20
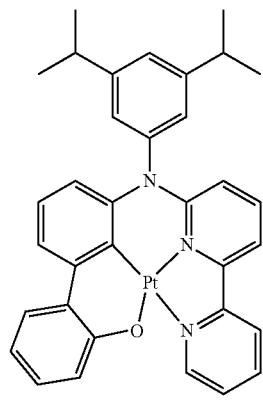
P21
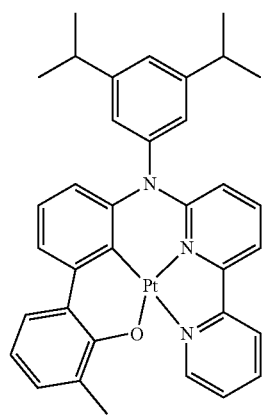
P22
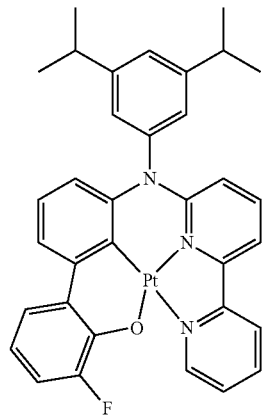

P23
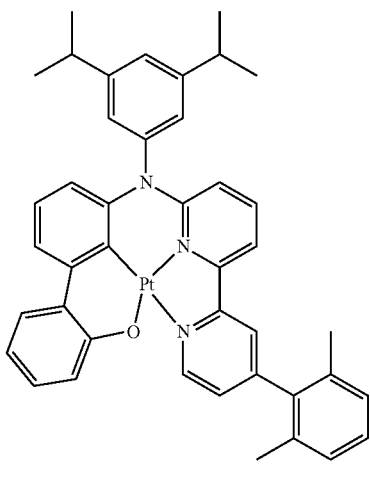
P24
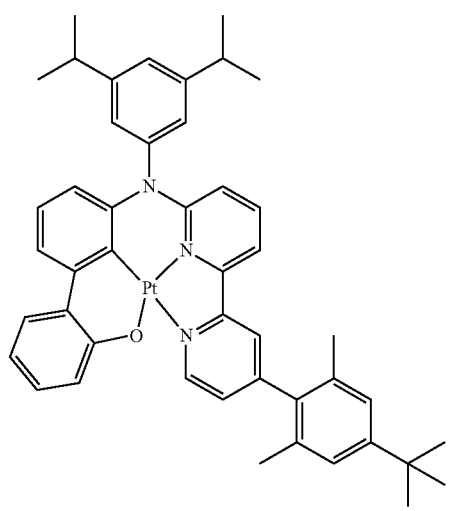
P25
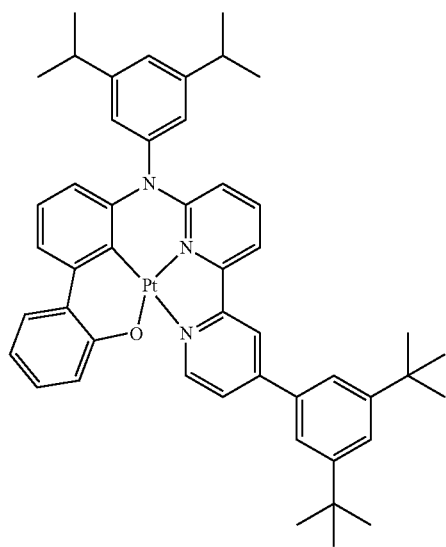
P26
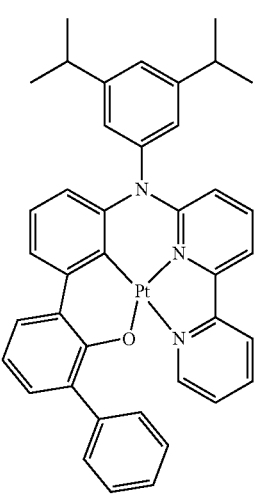
P27
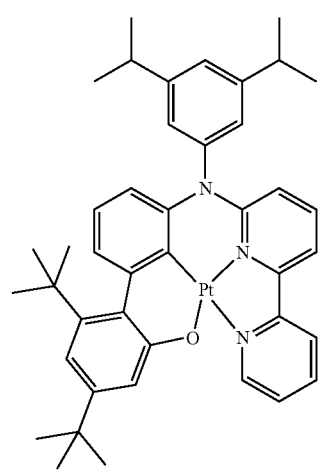
P28
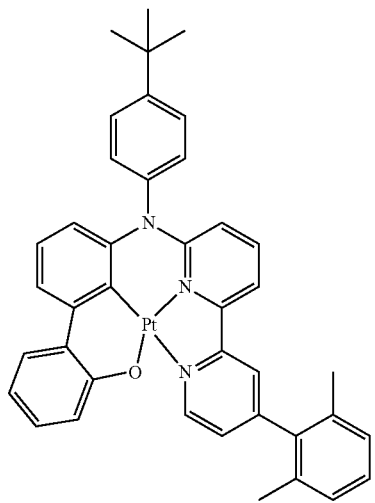

P29
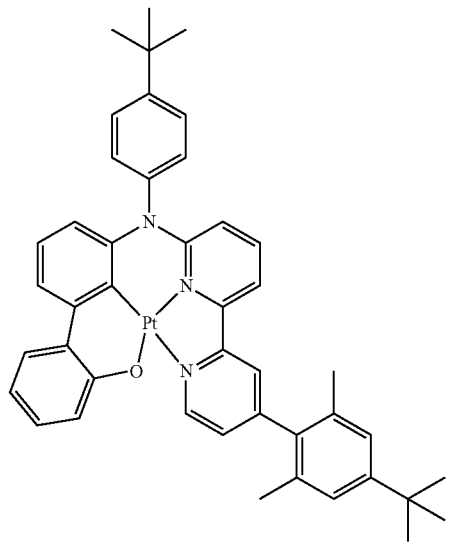
P30
P32
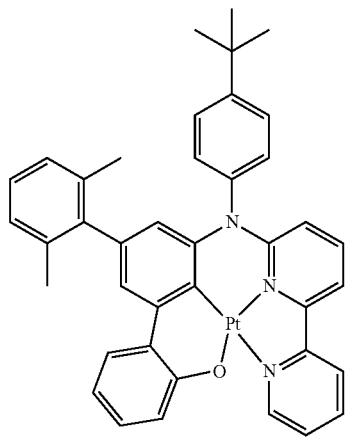
P33
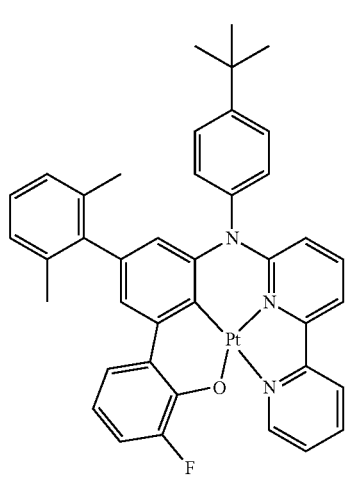
P31
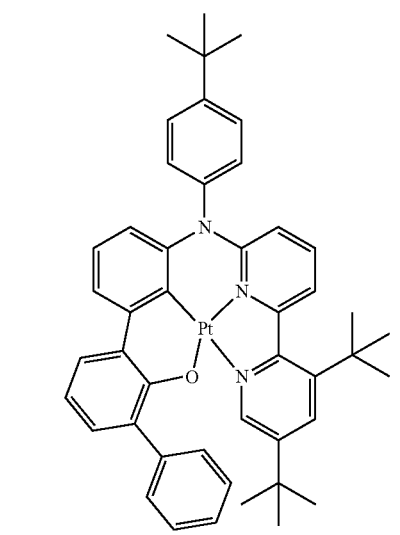
P34
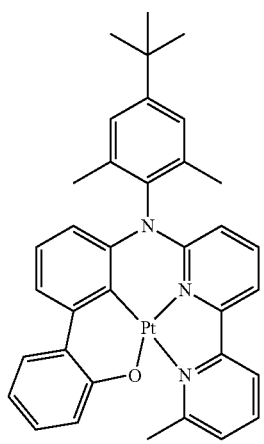

P35
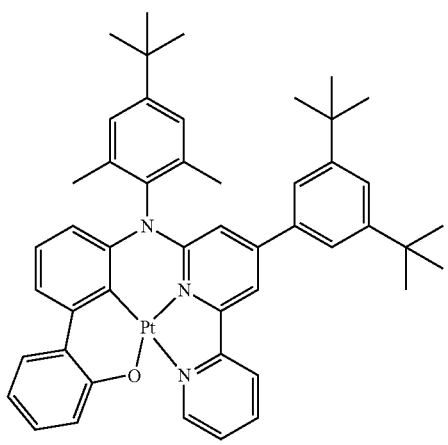
P38
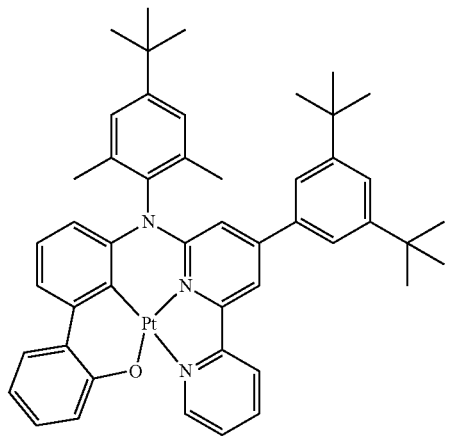
P36
P39
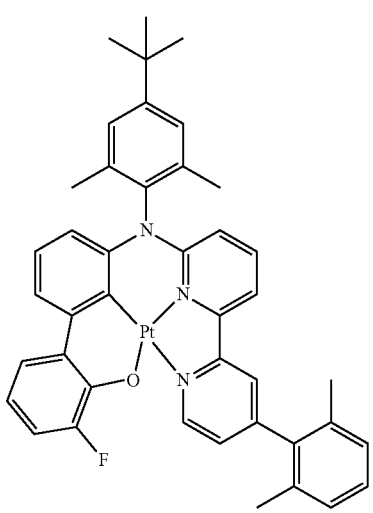
P37
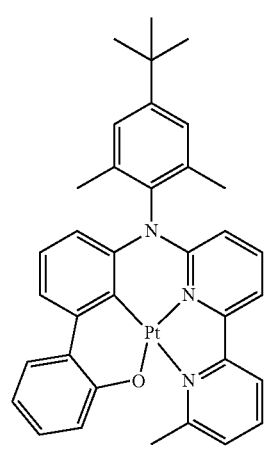
P40

P41
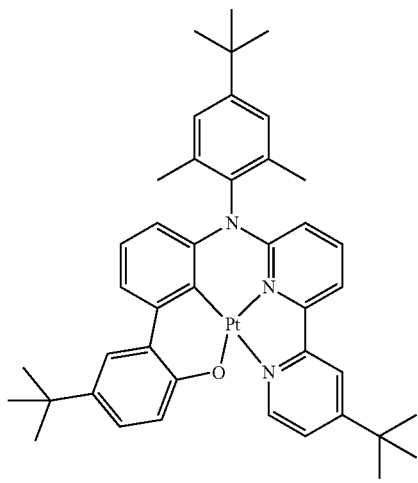
P44
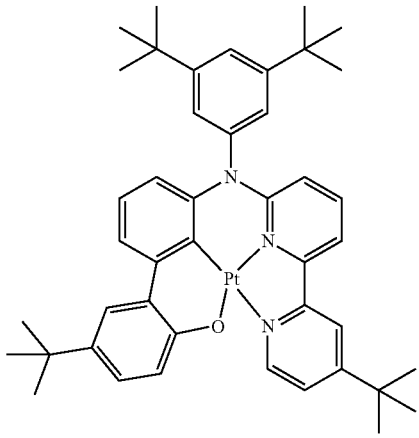
P42
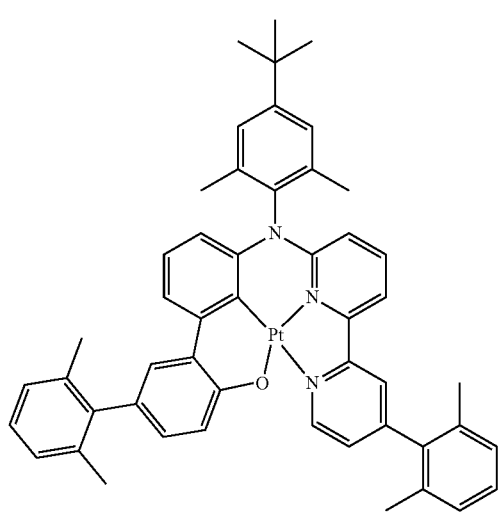
P45
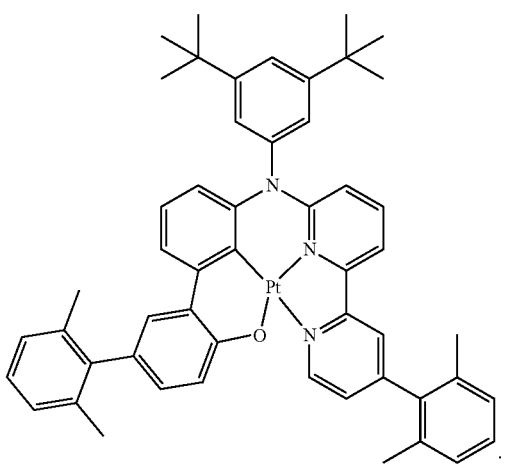
P43
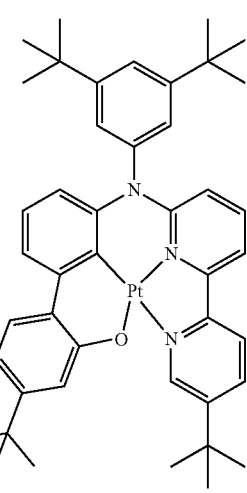
8. The complex according to claim 7, having one of the following structures:

P1

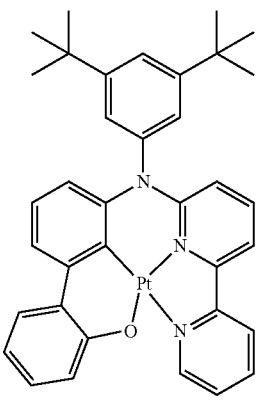

P6

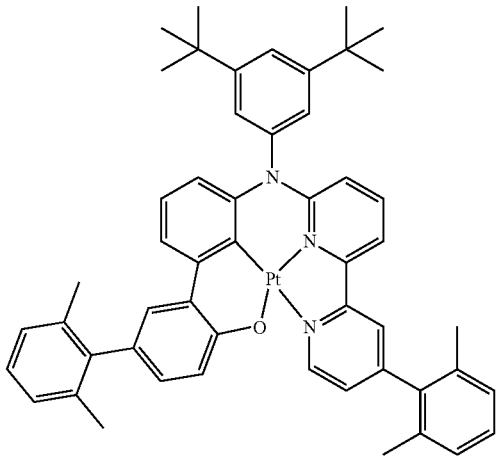

P45

9. A precursor of the complex according to claim 4, having a structural formula as follows:

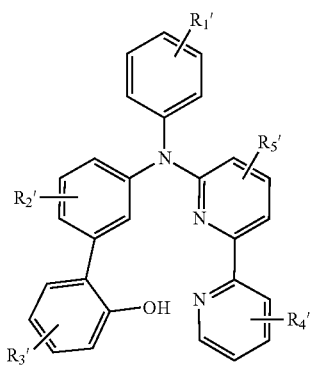

wherein:
$R_2'$ to $R_5'$ are independently selected from hydrogen, fluorine, a saturated alkyl group containing 1 to 10 carbon atoms, an aryl group containing 6 to 20 carbon atoms and unsubstituted or substituted by one or more C1 to C4 alkyl groups, $R_1'$ is independently selected from hydrogen, a saturated alkyl group containing 1 to 10 carbon atoms.

10. A method for synthetizing the N^N^C^O tetradentate platinum (II) complex according to claim 1, comprising the following steps:
performing a Buchwald-Hartwig coupling reaction on initial substrates S1 and S2 to obtain a substrate S3;
performing a Buchwald-Hartwig coupling reaction on the S3 and S4 to obtain a substrate S5;
performing demethylation on the S5 under the effect of pyridine hydrochloride to obtain S6; and
performing a reaction on the S6 and $K_2PtCl_4$ to obtain a target product P, wherein the reaction formula is as follows:

P24

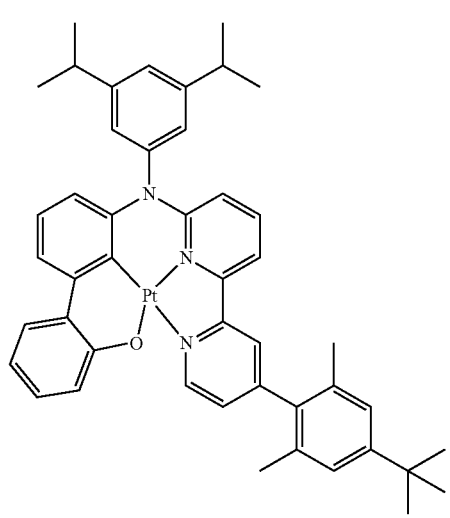

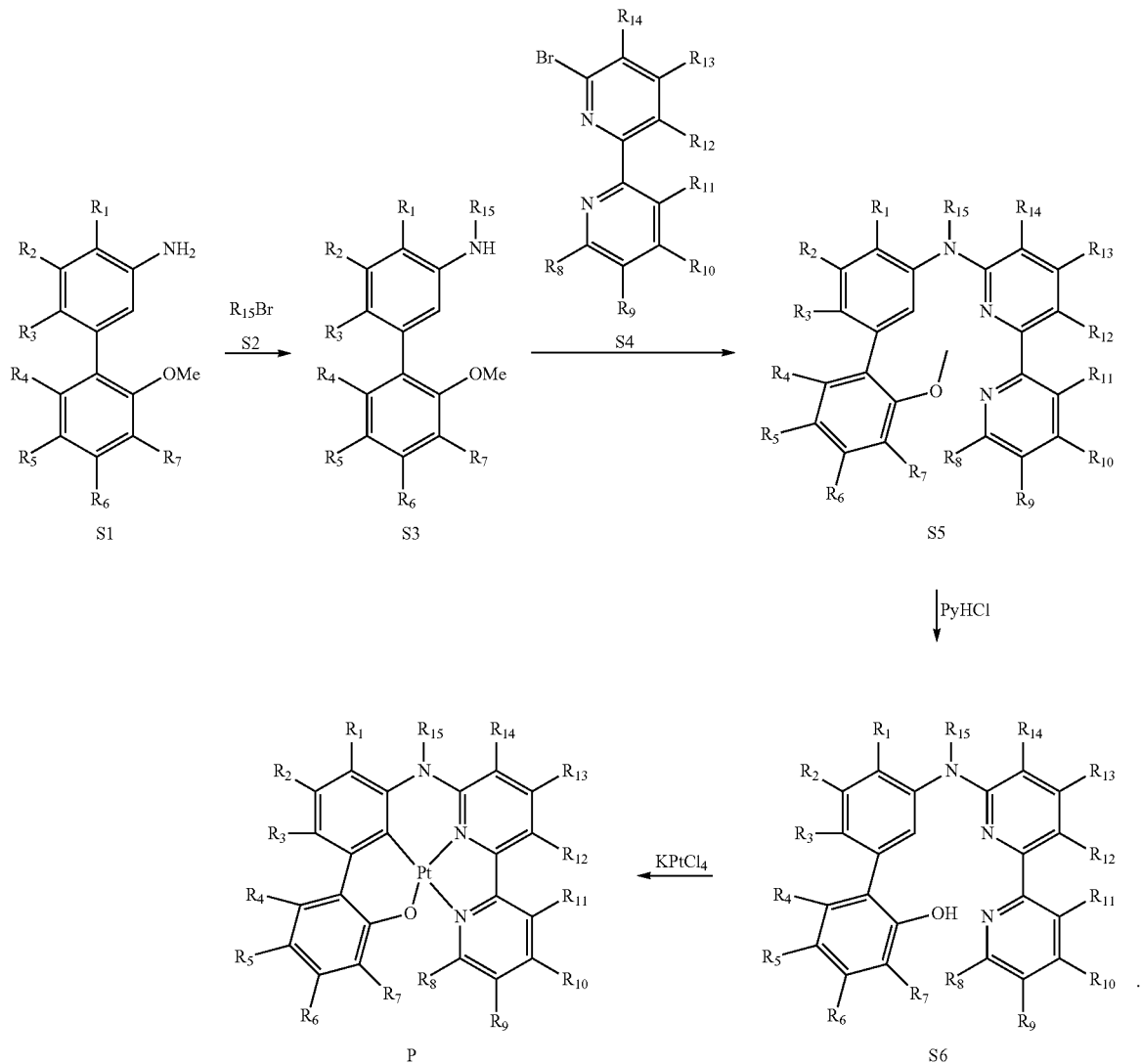

11. An application of the complex according to claim 1 to an OLED light-emitting device.

12. The application according to claim 11, wherein complex is a phosphorescent doped material in a light-emitting layer.

13. A precursor, of the complex according to claim 1, having a structural formula as follows:

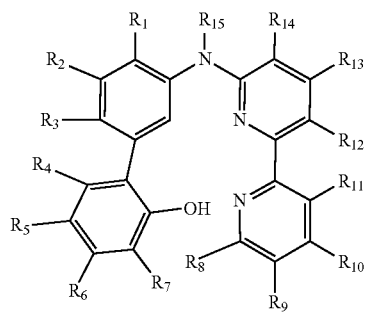

wherein:

$R_1$ to $R_{14}$ are independently selected from hydrogen, fluorine, a saturated alkyl group containing 1 to 10 carbon atoms, an aryl group containing 6 to 20 carbon atoms and unsubstituted or substituted by halogen or one or more C1 to C4 alkyl groups, $R_{15}$ are independently selected from an aryl group containing 6 to 20 carbon atoms and unsubstituted or substituted by one or more C1 to C4 alkyl groups.

14. A method for synthetizing the N^N^C^O tetradentate platinum(II) complex according to claim 2, comprising the following steps:

performing a Buchwald-Hartwig coupling reaction on initial substrates S1 and S2 to obtain a substrate S3;

performing a Buchwald-Hartwig coupling reaction on the S3 and S4 to obtain a substrate S5;

performing demethylation on the S5 under the effect of pyridine hydrochloride to obtain S6; and performing a reaction on the S6 and $K_2PtCl_4$ to obtain a target product P, wherein the reaction formula is as follows:

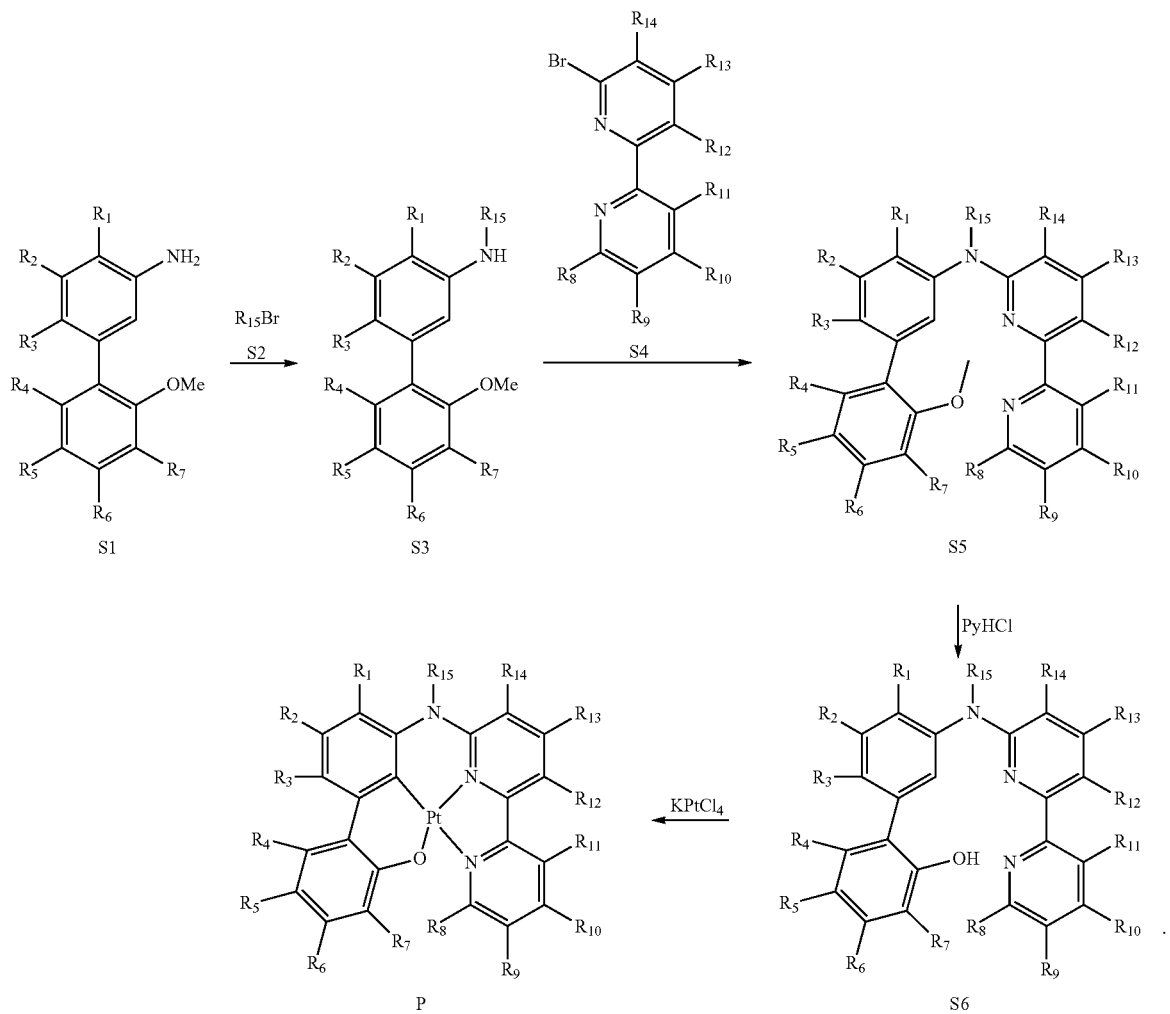

15. An application of the complex according to claim 7 to an OLED light-emitting device.

16. The application according to claim 15, wherein the applied complex is a phosphorescent doped material achieving a photon emission effect in a light-emitting layer.

17. A precursor of the complex according to claim 13, having a structural formula as follows:

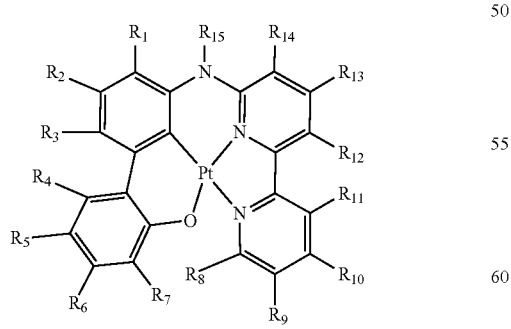

wherein:
0 to 2 of the 14 groups of $R_1$ to $R_{14}$ are independently represented as an aryl group containing 6 to 10 carbon atoms and unsubstituted or substituted by 1 to 3 C1 to C4 alkyl groups, and other groups are independently represented as hydrogen, fluorine or a saturated alkyl group containing 1 to 8 carbon atoms;

$R_{15}$ is independently represented as an aryl group containing 5 to 10 carbon atoms and unsubstituted or substituted by 1 to 3 C1 to C4 alkyl groups.

18. A precursor of the complex according to claim 17, having a structural formula as follows:

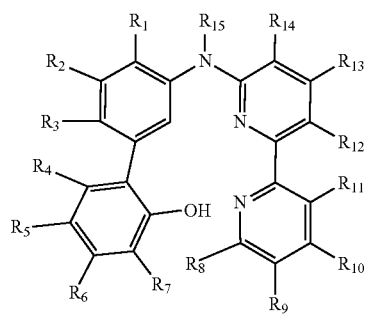

wherein:
0 to 2 of the 14 groups of $R_1$ to $R_{14}$ are independently represented as a phenyl group, and other groups are independently represented as hydrogen, fluorine or a saturated alkyl group containing 1 to 4 carbon atoms,
$R_{15}$ is independently represented as a phenyl group.

* * * * *